(12) United States Patent
Bryan et al.

(10) Patent No.: US 12,045,737 B2
(45) Date of Patent: Jul. 23, 2024

(54) SYSTEMS AND METHODS FOR DESIGN PARAMETER SELECTION

(71) Applicant: The MathWorks, Inc., Natick, MA (US)

(72) Inventors: Thomas A. Bryan, Westborough, MA (US); Jenna L Warren, Watertown, MA (US)

(73) Assignee: The MathWorks, Inc., Natick, MA (US)

( * ) Notice: Subject to any disclaimer, the term of this patent is extended or adjusted under 35 U.S.C. 154(b) by 1038 days.

(21) Appl. No.: 16/947,130

(22) Filed: Jul. 20, 2020

(65) Prior Publication Data

US 2022/0019915 A1   Jan. 20, 2022

(51) Int. Cl.
*G06N 5/04* (2023.01)
*G06F 30/20* (2020.01)
*G06N 20/00* (2019.01)

(52) U.S. Cl.
CPC ............. *G06N 5/04* (2013.01); *G06F 30/20* (2020.01); *G06N 20/00* (2019.01)

(58) Field of Classification Search
CPC .......... G06N 5/04; G06N 20/00; G06F 30/20; G06F 8/35; G06F 17/12; G06F 17/16
See application file for complete search history.

(56) References Cited

U.S. PATENT DOCUMENTS 5,528,741 A * 6/1996 Lucas .................. H03M 7/24
                                                345/593
6,460,177 B1 * 10/2002 Lee ..................... G06F 9/4488
                                                717/146
8,484,262 B1   7/2013 Bryan
(Continued)

FOREIGN PATENT DOCUMENTS

CN   107066673 A  *  8/2017  ............. G06F 30/20
CN   112629883 A  *  4/2021  ........... G01M 17/007

OTHER PUBLICATIONS

Liu et al. "Dynamic range, stability, and fault-tolerant capability of finite-precision RLS systolic array based on Givens rotations," IEEE Transactions on Circuits and Systems, vol. 38, No. 6, pp. 625-636, Jun. 1991, doi: 10.1109/31.81857.
(Continued)

*Primary Examiner* — Joseph J Dallo
(74) *Attorney, Agent, or Firm* — Finnegan, Henderson, Farabow, Garrett & Dunner, LLP

(57) ABSTRACT

Systems and methods as disclosed for selecting parameters for use by a system. The parameters can describe a behavior of the system, which can be represented by a model having an input and an output. The model can include an operation representable by a matrix. The parameters can include the input and output ranges of the operation, the dimensions of the matrix, a noise value for the system, and an overflow probability. A design environment can be configured to determine values or ranges of values for one or more of the parameters based on values or ranges of values of the remaining parameters. In some embodiments, the design environment can select, recommend, or validate a choice of datatype, minimum system noise, or the dimensions of the matrix. The model can be used to generate code, which can be used to configure the system to perform the operation.

31 Claims, 11 Drawing Sheets

(56) References Cited

U.S. PATENT DOCUMENTS

| | | | |
|---|---|---|---|
| 8,495,114 | B1 | 7/2013 | Bryan et al. |
| 9,015,681 | B1 | 4/2015 | Bryan et al. |
| 9,146,750 | B2 | 9/2015 | Bryan et al. |
| 9,244,667 | B2 | 1/2016 | Wall et al. |
| 9,335,979 | B1 | 5/2016 | Bryan et al. |
| 9,436,442 | B1 * | 9/2016 | Kintali ............... G06F 8/35 |
| 9,582,469 | B1 | 2/2017 | Bryan |
| 10,095,487 | B1 | 10/2018 | Venkatesan et al. |
| 10,168,990 | B1 | 1/2019 | Annamalai et al. |
| 10,990,713 | B1 | 4/2021 | Hochman et al. |
| 2004/0215676 | A1 * | 10/2004 | Tang ............... G06F 7/483 708/204 |
| 2008/0040409 | A1 * | 2/2008 | Matsuzaki ............ G06F 8/443 708/204 |
| 2014/0059524 | A1 * | 2/2014 | Kee ................. G06F 8/49 717/154 |
| 2015/0142707 | A1 | 5/2015 | Charif et al. |

OTHER PUBLICATIONS

SAQIB "Smart IP of QR Decomposition for Rapid Prototyping on FPGA", Masters Thesis, Massachusetts Institute of Technology, Feb. 2014, XP055804353, Retrieved from the internet: URL:https://dspace.mit.edu/handle/1721.1/87949 [Retrieved on Feb. 14, 2021] (212 pgs.).

MANOHAR "Addressing Fixed Point Design Challenges", MathWorks, 2015, XP055804357, retrieved from the internet: URL: https://www.mathworks.com/content/dam/mathworks/mathworks-dot-com/solutions/automotive/files/in-expo-2015/addressing-fixed-point-design-challenges.pdf. [Retrieved on may 14, 2021] (22 pgs.).

Extended European Search Report received in EP Application No. 20210235.6, dated May 21, 2021.

Berkeley Design Technology, Inc., "An Independent Analysis of Altera's FPGA Floating-point DSP Design Flow", (2011), 10 pages.

Berkeley Design Technology, Inc., "Floating-point DSP Design Flow and Performance on Altera 28 nm FPGAs", (Oct. 2012), 12 pages.

Berkeley Design Technology, Inc., "An Independent Evaluation of Floating-point DSP Energy Efficiency on Altera 28 nm FPGAs", (Feb. 2013), 9 pages.

Behar, V. et al., "Parameter Optimization of the adaptive MVDR QR-based beamformer for jamming and multipath suppression in GPS/GLONASS receivers", In: Proc. 16$^{th}$ Saint Petersburg International Conference on Integrated Navigation systems, Saint Petersburg, Russia, (May 2009), pp. 325-334.

Bryan, T., "Perform QR Factorization Using CORDIC", url: https://www.mathworks.com/help/fixedpoint/ug/perform-qr-factorization-using-cordic.html, (2010), 16 pages.

Capon, J., "High-Resolution Frequency-Wavenumber Spectrum Analysis", Proceedings of the IEEE, vol. 57, No. 8, (Aug. 1969), pp. 1408-1418.

Chen, Z. et al., "Condition Nos. of Gaussian Random Matrices". In: Siam J. Matrix Anal. Appl. 27.3, pp. 603-620. ISSN: 0895-4798. doi: 10.1137/040616413. url: http://dx.doi.org/10.1137/040616413, (Jul. 2005), 18 p.

Edelman, A., "Eigenvalues and Condition Numbbers of Random Matrices", Ph.D. Thesis, Numerical Analysis Report 89-7, Massachusetts Institute of Technology, Department of Mathematics, Cambridge, MA, (May 1989), 106 pages.

Erickson, J. et al., "You Don't Always Need to Convert to Fixed Point for FPGA or ASIC Deployment—MATLAB & Simulink", Technical Articles, MathWorks, Inc., Retrieved from the Internet on Jan. 22, 2024, url: https://www.mathworks.com/company/newsletters/articles/you-dont-always-need-to-convert-to-fixed-point-for-fpga-or-asic-deployment.html, (2018), 6 pages.

Parker, M. et al., "QR Decomposition using FPGAs", In: 2016 IEEE National Aerospace and Electronics Conference (NAE-CON) and Ohio Innovation Summit (OIS), doi: 10.1109/NAECON.2016.7856841. url: https://ieeexplore.ieee.org/document/7856841, (Jul. 2016), pp. 416-421.

Rader, C. M., "VLSI Systolic Arrays for Adaptive Nulling", IEEE Signal Processing Magazine, (Jul. 1996), pp. 29-49.

Rudelson, M. et al., "Smallest singular value of a Random Rectangular Matrix", Comm. Pure Appl. Math, (2009), pp. 1707-1739.

Szarek, S. J., "Condition numbers of random matrices", Journal of Complexity, vol. 7, (1991), pp. 131-149.

Volder, J. E., "The CORDIC Trigonometric Computing Technique", IRE Trans. Electron. Comput, EC, vol. 8, (1959), pp. 330-334.

Volder, J. E., "The Birth of CORDIC", Journal of VLSI Signal Processing, Kluwer Academic Publishers, vol. 25, (2000), pp. 101-105.

Walther, J. S., "A Unified Algorithm for Elementary Functions", Proceedings of the May 18-20, 1971, Spring Joint Computer Conference, Hewlett-Packard Company, Palo Alto, CA, (1971), pp. 379-385.

Wishart, J., "The Generalised Product Moment Distribution in Samples from a Normal Multivariate Population", Biometrika, Oxford University Press on behalf of Biometrika Trust, vol. 20A, No. 1/2, (Jul. 1928), 21 pages.

* cited by examiner

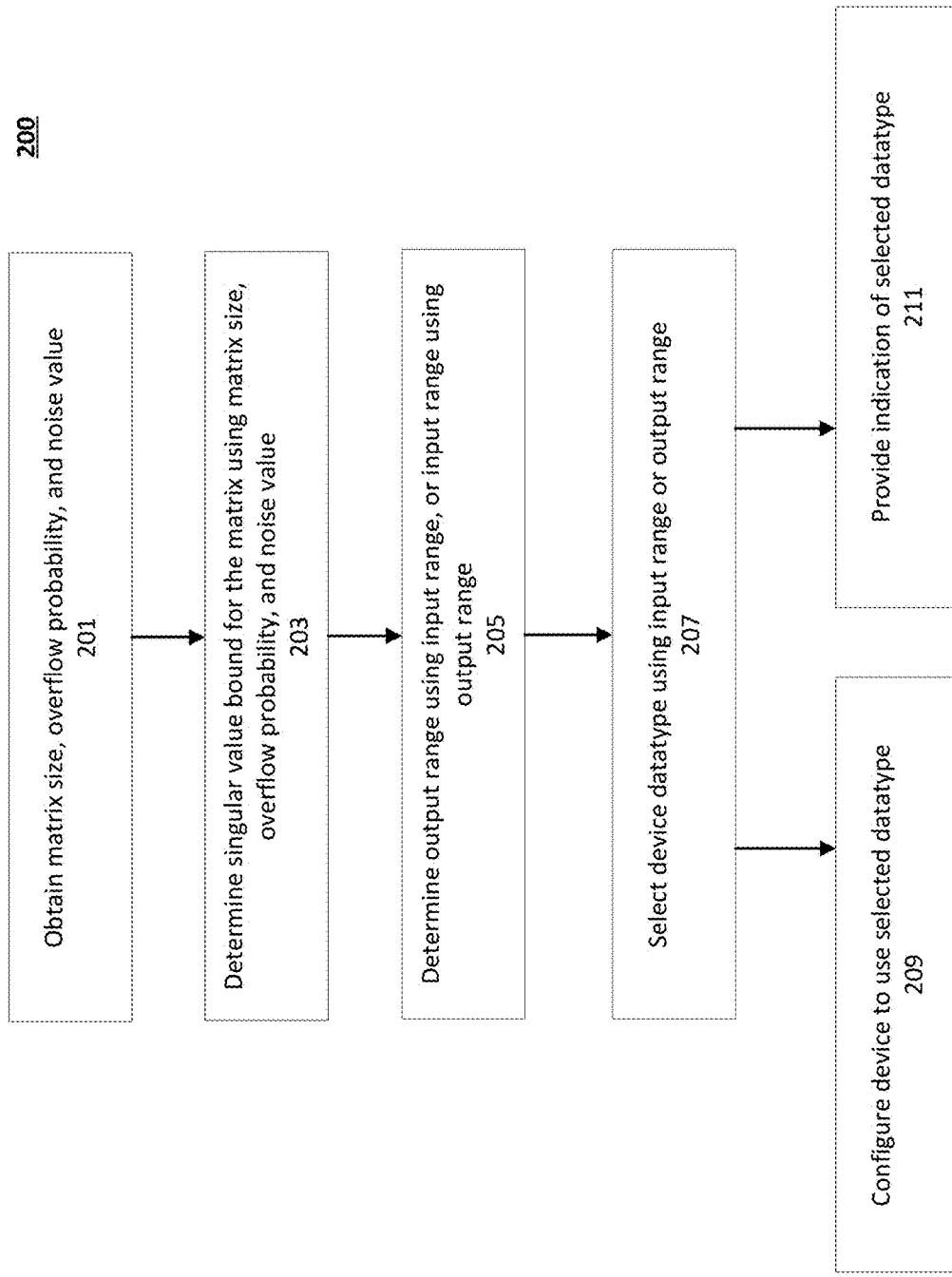

FIG. 6

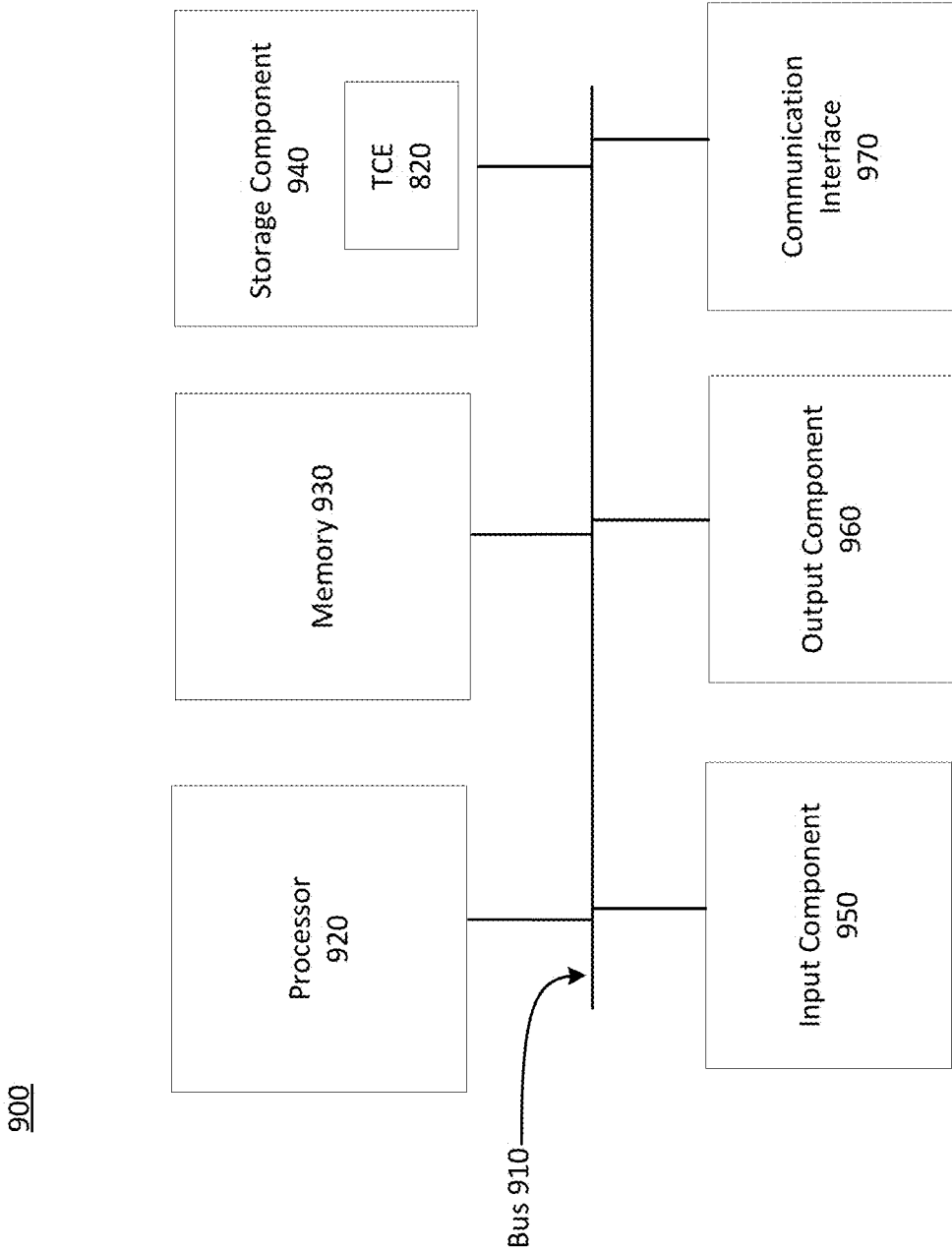

SYSTEMS AND METHODS FOR DESIGN PARAMETER SELECTION

SUMMARY

The disclosed systems and methods relate to determination and selection of design parameters. The disclosed embodiments include a method for selecting a datatype for use by software running on a device. The method can concern a model representing a behavior of the device, wherein the model has an input and an output and includes an operation representable by a matrix. The method can include obtaining a size of the matrix, an overflow probability for the operation, and statistics information concerning a noise of the device. The method can further include determining a singular value bound for the matrix based on the size, the overflow probability, and the statistics information. The method can also include determining one or more of a numerical range for the output based on information about the input and the singular value bound, or a numerical range for the input based on information about the output and the singular value bound. The method can further include selecting the datatype for the input or the output, based at least in part on the determined numerical range of the output, or the determined numerical range of the input. The method can additionally include providing an indication of the selected datatype.

In some embodiments, the method can further include simulating the behavior of the device using the selected datatype. The method can further include generating the software for the device from the model using the selected datatype. The method can further include deploying the generated software onto the device.

In some embodiments, the selected datatype can be a fixed-point datatype or a floating-point datatype. The noise can be thermal noise or quantization noise. The operation can include least-squares estimation, neural network training or prediction, or Kalman filtering. The matrix can represent differential equations characterizing the operation.

The device can include: a detection system or controller; or a beamformer, radar direction finder, or anti-jamming device.

The disclosed embodiments include a method for determining statistics information concerning a noise of a system. The method can concern a model representing a behavior of the system. The model can have an input and an output and includes an operation representable by a matrix. The method can include obtaining a size of the matrix, an overflow probability for the operation, and a numerical input range and a numerical output range of the model. The method can further include determining a singular value bound for the matrix based on the size, numerical input range, and numerical output range. The method can also include determining, using the singular value bound and the overflow probability, statistics information concerning a noise of the system. The method can also include providing an indication of the minimum noise value.

In some embodiments, the noise can be thermal noise or quantization noise. The operation can include least-squares estimation, neural network training or prediction, or Kalman filtering. The matrix can represent differential equations characterizing the operation. Obtaining the size of the matrix can include generating the matrix by linearizing non-linear ordinary differential equation.

In some embodiments, the system can include a detection system or controller; or a beamformer, radar direction finder, or anti jamming device.

The disclosed embodiments include method for determining, for a model representing a behavior of a device, the model having an input and an output and including a matrix representing characteristics or operations of the device, dimensions of the matrix. The method can include obtaining an input range, output range, noise value for a noise in the device, and overflow probability for the device. The method can further include determining, using the input range and the output range, a scaled singular value bound for the matrix. The method can also include determining, using the scaled singular value bound, the overflow probability, and the noise value a size of the matrix, the size specifying a number of observations and a number of values for each observation. The method can also include providing an indication of the determined size of the matrix.

In some embodiments, the noise is thermal noise or quantization noise. The characteristics or operations can include least-squares estimation, neural network training or prediction, or Kalman filtering. The method can further include configuring the device to determine device outputs using the number of observations and the number of values for each observation. The device comprises a beamformer, radar direction finder, or anti jamming device.

The disclosed embodiments include a system for selecting a datatype for use by software running on a device. The system can include at least one processor and at least one non-transitory computer-readable medium containing instructions. When executed by the at least one processor, the instructions can cause the system to perform operations. The operations can concern a model representing a behavior of the device, wherein the model has an input and an output and includes an operation representable by a matrix. The operations can include obtaining a size of the matrix, an overflow probability for the operation, and statistics information concerning a noise of the device. The operations can further include determining a singular value bound for the matrix based on the size, the overflow probability, and the statistics information. The operations can also include determining one or more of a numerical range for the output based on information about the input and the singular value bound, or a numerical range for the input based on information about the output and the singular value bound. The operations can also include selecting the datatype for the input or the output, based at least in part on the determined numerical range of the output, or the determined numerical range of the input. The operations can also include providing an indication of the selected datatype.

The disclosed embodiments include a non-transitory computer-readable medium containing instructions. The instructions, when executed by at least one processor, can cause a system to perform operations. The operations can concern a model representing a behavior of a device, wherein the model has an input and an output and includes an operation representable by a matrix. The operations can include obtaining a size of the matrix, an overflow probability for the operation, and statistics information concerning a noise of the device. The operations can also include determining a singular value bound for the matrix based on the size, the overflow probability, and the statistics information. The operations can additionally include determining one or more of a numerical range for the output based on information about the input and the singular value bound, or a numerical range for the input based on information about the output and the singular value bound. The operations can further include selecting the datatype for the input or the output, based at least in part on the determined numerical range of the output, or the determined numerical range of the input. The operations can also include providing an indication of the selected datatype.

It is to be understood that both the foregoing general description and the following detailed description are exemplary and explanatory only and are not restrictive of the disclosed embodiments, as claimed.

BRIEF DESCRIPTION OF THE DRAWINGS

The drawings are not necessarily to scale or exhaustive. Instead, emphasis is generally placed upon illustrating the principles of the embodiments described herein. The accompanying drawings, which are incorporated in and constitute a part of this specification, illustrate several embodiments consistent with the disclosure and, together with the description, serve to explain the principles of the disclosure. In the drawings:

FIG. 2 depicts an exemplary method of selecting a datatype for use by a device, consistent with disclosed embodiments.

FIG. 6 depicts an exemplary user interface suitable of use with disclosed embodiments.

FIG. 9 depicts an exemplary device suitable for use consistent with the disclosed embodiments.

DETAILED DESCRIPTION

Figure 1A:
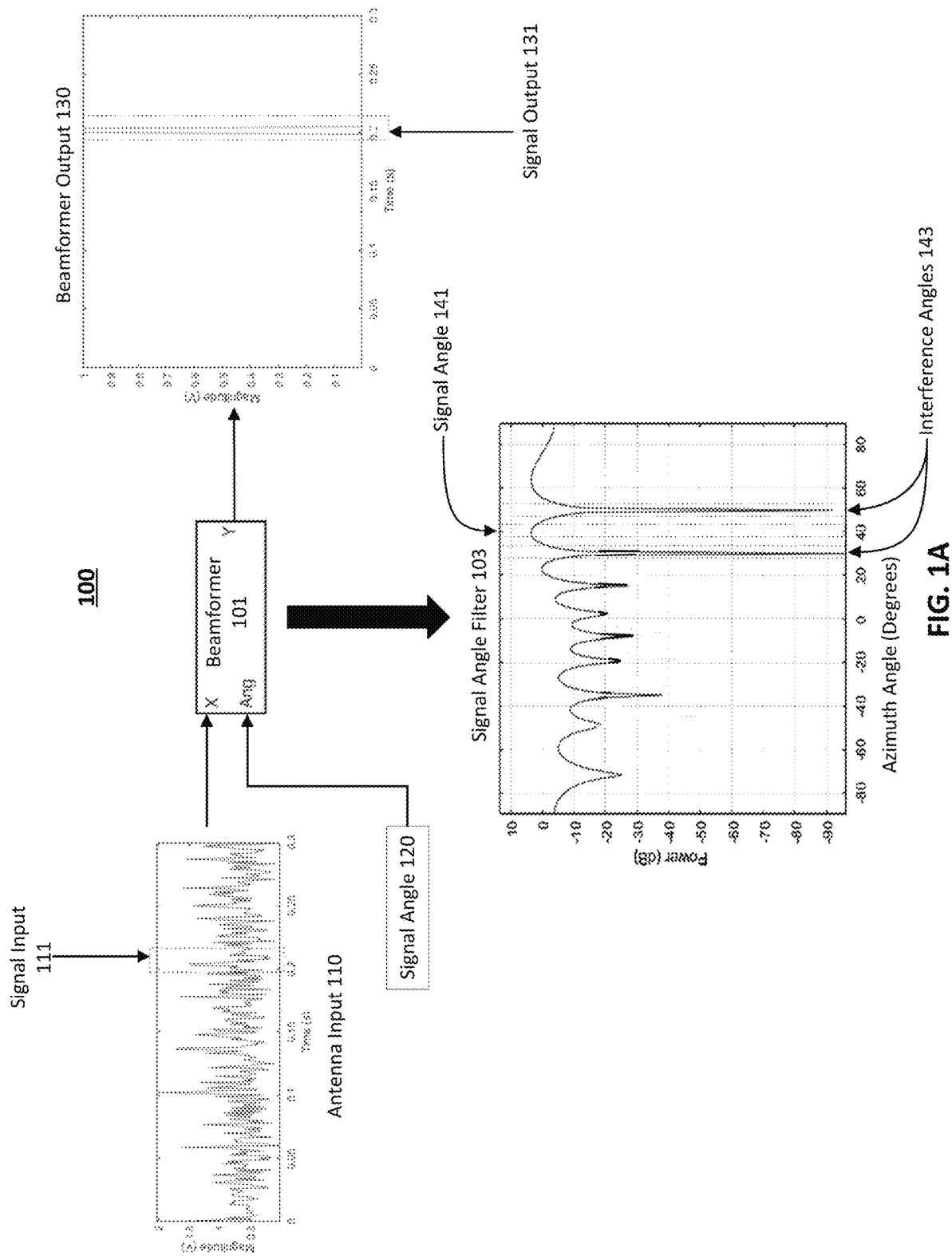
FIG. 1A depicts an exemplary design environment including an exemplary model, consistent with disclosed embodiments.

Reference will now be made in detail to exemplary embodiments, discussed with regards to the accompanying drawings. In some instances, the same reference numbers will be used throughout the drawings and the following description to refer to the same or like parts. Unless otherwise defined, technical and/or scientific terms have the meaning commonly understood by one of ordinary skill in the art. The disclosed embodiments are described in sufficient detail to enable those skilled in the art to practice the disclosed embodiments. It is to be understood that other embodiments may be utilized and that changes may be made without departing from the scope of the disclosed embodiments. For example, unless otherwise indicated, method steps disclosed in the figures can be rearranged, combined, or divided without departing from the envisioned embodiments. Similarly, additional steps may be added or steps may be removed without departing from the envisioned embodiments. Thus, the materials, methods, and examples are illustrative only and are not intended to be necessarily limiting.

The operation, e.g., control or behavior, of certain devices involves calculating the solutions to a system of equations. In some examples, the calculations are performed by an embedded system on the devices. In other examples, at least part of or all of the calculations are performed by one or more processors independent of the devices, and the results of the calculations or intermediate values generated during the calculations can be encoded or packaged to load onto the devices for the operation of the devices. In some situations, the system equations are linear equations or can be represented by equations in linear forms, e.g., be linearized around certain operating points. For simplicity of description, from hereon, the system of linear equations is used, yet it is understood that the disclosed methods and systems can be readily applied to devices that involve system of equations that include non-linear equation(s). Using known techniques, the non-linear equations can be represented by linear equations around various operating points. The system of linear equations may represent the relationship between two variables, such as characteristics (e.g., kinematics, transfer function from a device input to a device output, a state-space representation, or the like) of a device (or an approximation of the characteristics of the device), measurements in the presence of noise or interference, the relationship between experimental conditions and experimental outputs, or similar relationships. Devices that calculate such solutions can include filters (e.g., least-squares, least-mean square (LMS), recursive least squares (RLS), beamforming, Kalman filters, or the like), computing devices configured to model the mechanical, electrical, thermal, or material handling properties of devices, components, or structures (e.g., finite-element modeling systems), control systems (e.g., controllers implemented using, for example, state space models of systems of linear or linearized ordinary or partial differential equations), devices configured to perform neural network training or prediction (e.g., formulated as matrix operations), statistical regression, clustering, or classifier systems, or the like. Exemplary devices include, but are not limited to, radar systems, hearing aids, beamformers, radar direction finders, anti jamming devices, control systems (e.g., automobile cruise-control systems, aerospace control systems, industrial robotics control systems, manufacturing plant process control systems, or the like), machine learning systems (e.g., ranking, or recommender systems, reinforcement learning systems, biometric authentication systems), optimization systems (e.g., linear programming, dynamic programming), decision systems (e.g., Markov decision processes), or the like.

The disclosed embodiments can be used in the context of model-based design. The operation of the device can be simulated by a model. The model can be executable in a design environment (e.g., a computing environment, such as a technical computing environment, or a modeling or simulation environment). The design environment can solve the system of equations to simulate the performance of the device. Such simulation can speed the design process by allowing for rapid iteration and testing of designs. Once the device operates as intended or required, code (e.g., Ada, Basic, C, C++, C#, FORTRAN, machine code, assembly code, Hardware Description Language (HDL) code, VHDL, Verilog, SystemC, or netlists, GPU code such as CUDA code, bytecode, or executables configured to run on a GPU) corresponding to the model can be generated and deployed onto the device. The code can be automatically generated or manually generated. The device can execute the code to, at least in part, solve or determine solutions for the system of equations, hopefully causing the device to operate as simulated. The design process can include selecting representation(s) of numerical values for use by the device, which can affect the operation of the device, as the selected representation(s) determine the range and precision of numerical values supported by the device.

The disclosed embodiments can be used to determine a datatype for representing one or more variables in a model, given the model and design parameters for implementing the model. Alternatively, given design parameters for implementing the model, the disclosed embodiments can be used to determine characteristics of the model.

The disclosed embodiments can also be used in code generation or validation. In some instances, the disclosed systems and methods can be used when generating lower level code that implements the behavior of a program written in a higher-level language (e.g., when generating C code to implement a program written in MATLAB code). In various embodiments, the disclosed systems and methods can be used when validating that code performs according to a specification.

An exemplary system of linear equations may be of the form:

$$Ax=b \qquad (EQ. 1)$$

In EQ. 1, x may be a vector to be estimated, b may be a vector of known values, and A may be a matrix describing a relationship between the vector x and the vector b. For example, a device configured to perform ordinary least-squares regression can solve a system of linear equations in which a design matrix A relates a vector of explanatory variable values x to a vector of observation values b. Each column of A can correspond to an explanatory variable and each row of A can correspond to an observation. The device can be configured to estimate the value of the vector x from the design matrix A and the measured output matrix b. An exemplary application of EQ. 1 is discussed in FIG. 1A with respect to the design of an adaptive beamformer.

Devices configured to numerically solve EQ. 1 (e.g., using code deployed to the device, or the like), can be constrained in the range and precision of the numerical values that they can represent. Such constraints can be physical or hardware constraints (e.g., word length, memory size, register size, presence or absence of a floating-point unit, latency, or the like). Constraints may directly involve the datatype (e.g., word length, or the like), or may be implicated in the choice of datatype (e.g., latency, or the like). These constraints can affect whether the device uses a fixed-point representation or a floating-point representation, or the number of bits (e.g., fixed word length, bit-width, or the like) used to represent numerical values. Furthermore, the range and precision required to accurately solve EQ. 1 can depend on the dimensions of matrix A and the values of matrices x or b. Device design may therefore include balancing hardware capabilities (e.g., fixed-or floating-point representation, bit width, system noise) against model specifications (e.g. the dimensions of matrix A, the maximum values of matrices x or b). As hardware capabilities and model specifications may both affect device performance and device cost, striking the correct balance may be an important aspect of device design.

In a fixed-point representation, a numerical value can be represented by a fixed number of digits after the decimal point (and sometimes a fixed number of digits before the decimal place). Some fixed-point representations can represent a numerical value as an integer, scaled by some scaling factor. For example, numerical values ranging from 0 to 2.55 can be represented using integers ranging from 0 to 255 and a scaling factor of 100. The scaling factor may be stored explicitly or may be implicit in the representation. In floating-point representation, a numerical value may be represented by a significand, a base, and an exponent. In some implementations, the significand and the exponent may be stored, while the base may be implicit in the configuration of the device.

A device using a floating-point representation may be able to represent a larger range of values with greater precision than a device using a fixed-point representation, for a given number of bits. For example, a 32-bit floating-point numerical value (e.g., an IEEE 754 32-bit single precision numerical value) may have a maximum value of $(2-2^{-23})\times 2^{127}$ (i.e. approximately $3.4028235\times 10^{38}$), while a 32-bit fixed-point numerical value may have a maximum value of $2^{31}-1$ (i.e. 2,147,483,647).

A device configured to use a greater number of bits can represent a numerical value with increased range and precision, given a type of representation (e.g., fixed-point, or floating-point). For example, a device using 64-bit floating-point numbers can represent a larger range of values with greater precision than a device using 32-bit floating-point numbers. Similarly, a device using 64-bit fixed-point numbers can represent a larger range of values with greater precision than a device using 32-bit fixed-point numbers.

A device may experience an overflow error when an operation (e.g., a calculation) would result in a numerical value greater than the maximum numerical value the device supports for a variable. For example, a device may be configured to use a signed 32-bit fixed-point representation with scaling 1 for a variable. The maximum numerical value the device can represent for that variable would then be $2^{31}-1$. Should the device perform an operation that would result in numerical value greater than $2^{31}-1$ for that variable, the device could experience an overflow error. The overflow error could cause the operation to produce an incorrect result. Similarly, should the numerical representation lack sufficient precision, a precision loss (e.g., underflow or truncation) error could result, also potentially producing an incorrect result.

If not handled, the overflow or precision loss error could cause the device to behave in an incorrect or unintended manner. For example, when a variable is represented by an unsigned 8-bit integer, addition of the values 255 and 2 can result in the value 1, rather than the value 257. Similarly, subtraction of the value 1 from the value 0 can result in the value 255, rather than −1. All subsequent calculations that depend on this value will also be affected.

Selecting a datatype (e.g., an appropriate representation and number of bits to use to represent a variable) is therefore an important design decision when designing a device to operate according to at least EQ. 1. When the range of numerical values of a variable during device operation (e.g., the "dynamic range" of the variable) is known, an appropriate datatype (e.g., either a floating-point or fixed-point datatype of a suitable bit-length) can be selected. However, determining the dynamic range of the variable can be extremely difficult. For example, the value (e.g., scalar- or vector-value) of x can depend on the condition number of matrix A, which can in turn depend on the particular values of the matrix A. These values, and thus the dynamic range of x, may not be readily known during the design, e.g., modeling or simulation, of the device.

Some conventional device design approaches default to selecting floating-point representations with large bit-widths (e.g., double, or long double datatypes). But floating-point representations or large bit-widths may negatively affect the complexity and performance of the device. More complex components may represent numerical values using more bits. However, implementing a design using more complex hardware components may be more difficult and the resulting devices may cost more. Implementing a design using a floating-point representation, rather than a fixed-point representation may require additional hardware components, such as a floating-point unit, to handle floating-point operations. Additional memory may also be required, as code handling floating-point numbers may be larger and more complicated. For example, floating-point operation libraries may be larger than equivalent fixed-point operation libraries. Furthermore, floating-point operations may be slower or may consume more power than fixed-point operations. Accordingly, a device using floating-point operations may be slower, costlier, and less efficient than a device with similar capabilities that uses fixed-point operations.

Some conventional device design approaches rely on extensive simulation (e.g., hundreds to millions of trials) of a model representing the device in a software environment to determine a likelihood of overflow errors during operation of the device (e.g., by determining the dynamic range of variables to minimize the likelihood of overflow errors during operation of the device). Should such simulations reveal that a particular datatype results in overflow errors occurring with an acceptable probability, the device may be implemented using that particular datatype. However, reliance on extensive simulation can be time- and resource-intensive. Furthermore, extensive simulation requirements may reduce the flexibility of the design process.

Multiple design parameters, such as system noise (e.g., thermal noise, quantization noise, or the like) or the size of matrix A, can affect dynamic range. Such design parameters may include model parameters (e.g., the dimensions of matrix A) or hardware/device parameters (e.g., thermal noise, quantization noise, or the like). Changes to hardware/device parameters (e.g., changing components, device layouts, or the like) or to model parameters (e.g., changing the number of samples or observation collected or the number of measurements in each sample or observation, thereby changing the dimensions of matrix A) can therefore affect dynamic range. Changes to design parameters may therefore affect the datatype used in a model or used in code for a device implementing the model. Accordingly, when relying on simulation to avoid overflow errors, changes to design parameters may necessitate additional or repeated simulation.

In some instances, a required precision may also affect the choice of datatype. For example, a fixed-point datatype may be selected to avoid overflow and support a specified precision (e.g., to avoid precision loss error). Selecting the fixed-point datatype to support a specified precision can include selecting a number of precision bits. The specified precision may arise from the design of the system (e.g. signal-to-noise ratio in a signal-processing system, image resolution in an image-processing system, or how far a car can deviate from a planned route in a self-driving car system).

The disclosed embodiments include systems and methods for use in designing devices configured to solve equations of the form of EQ. 1. Consistent with disclosed embodiments, based on a specified overflow probability and known or estimated system noise, a bound can be determined on the smallest singular value of matrix A. This bound can be used to relate system noise, overflow probability, dynamic range, output precision, and the dimensions of matrix A.

The disclosed embodiments can be used to determine a suitable hardware implementation of model, given the model (e.g., when the model has been determined, the disclosed embodiment be used to determine datatypes and system noise for the model, thereby assisting selection of suitable hardware). For example, a datatype for one or more variables in the code executing on the device can be selected based on the dynamic range. The selected datatype can use the smallest number of bits (and thus the least memory) guaranteed to have an overflow probability less than the specified overflow probability. The selected datatype can also enable the device output to meet a given precision requirement. Alternatively, the disclosed embodiments can be used to determine a model, given hardware for implementing a model (e.g., when the datatype(s) have been determined by the hardware implementation, the disclosed embodiments can be used to determine aspects of the model, thereby assisting model design). For example, given a datatype a bound on the smallest singular value of matrix A can be determined. The dimensions of matrix A (and thus model characteristics like the number of samples or the forgetting factor used by the model) can then be selected based on this bound. A combination of approaches is also possible, in which changes to the hardware inform changes to the model (and vice versa) in an iterative process. Alternatively, the disclosed embodiments can be used to determine an overflow probability given a model and hardware for implementing the model. For example, given a device implementing a model, the disclosed embodiments can validate that the overflow probability is less than some specified value.

Dynamic Range Bound Determination

Consistent with disclosed embodiments, elements of matrix A in EQ. 1 can be modeled as taking random values drawn from a probability distribution (e.g., a signal plus a system noise having a known or assumed distribution). The smallest singular value of matrix A can then be a random value with a distribution dependent on the dimensions of A and the characteristics of the probability distribution of the values of A. When QR decomposition is used to solve EQ. 1, dynamic range bounds can be determined for each variable in the QR decomposition. The representation of each variable and the method used to perform QR decomposition and solve EQ. 1 can affect the bounds. For ease of explanation, bounds are disclosed for solution of EQ. 1 using a fixed-point representation, where decomposition is performed using Givens rotations implemented using the CORDIC algorithm. The disclosed embodiments are not limited to implementations using QR decomposition, or to implementations that use fixed-point representations, Givens rotations, or the CORDIC algorithm to perform QR decomposition.

Using QR decomposition, the m-by-n full-rank matrix A (where $m \geq n$) can be decomposed into the unitary m-by-n matrix Q and the n-by-n upper triangular matrix R. In some embodiments using fixed-point operations, the decomposition can be performed using Givens rotations implemented using the CORDIC algorithm. In such implementations, QR decomposition can be performed using only shifts and adds (e.g., without performing square-roots or division). Accordingly, such implementations can be pipelined and parallelized on device hardware such as an FPGA, ASIC, GPU, APU, DSP, or CPU resulting in improved device performance, reduced device design and development costs, or reduced device costs.

Consistent with disclosed embodiments, QR decomposition using the CORDIC algorithm can involve overwriting A with R and b with $c=Q'b$. In this manner, the solution to EQ. 1 can be computed as:

$$x=R^{-1} \cdot (Q'b)$$

In some embodiments, Q may not be explicitly computed, and R may be back-substituted rather than computing its inverse and multiplying it by ($Q'b$). Thus, in some embodiments, it may be necessary to determine bounds on the final and intermediate variables in this process (e.g., R, $c=Q'b$, and x).

The magnitude of the largest element in R can depend on the number of rows in A (e.g., m) and the magnitude of the largest element in A:

$$\max(|R(:)|) \leq \sqrt{m} \max(|A(:)|) \qquad \text{(EQ. 2)}$$

The magnitude of the largest element in the vector c can depend on the number of rows in A (e.g., m) and the magnitude of the largest element in b:

$$\max(|c(:)|) \leq \sqrt{m} \max(|b(:)|) \qquad \text{(EQ. 3)}$$

The gain factor arising from the CORDIC algorithm used to compute the QR decomposition can also be determined. In some embodiments, Givens rotations may be applied to produce rotations that require only bit-shifts and additions. The rotation angle can be chosen iteratively such that the $k^{th}$ rotation angle $\theta_k$ satisfies $\tan(\theta_k)=2^{-k}$. Then the Givens rotations can be expressed as:

$$\sqrt{1+2^{-2k}} \, G(\theta_k) = \begin{bmatrix} 1 & 2^{-k} \\ -2^{-k} & 1 \end{bmatrix}$$

The product of the gain factors for individual rotations, $\sqrt{1+2^{-2k}}$, quickly converges to approximately 1.6468. Therefore, after computing the Givens rotations using CORDIC, the inverse of the product of the gain factors may be multiplied by the result to normalize the gain.

The bounds in EQS. 2 and 3 can be determined from experimental data, device or component specifications, or the datatypes of the variables. For example, when A is a matrix of unsigned single-precision integers, the maximum value in A is $2^{31}-1$. As an additional example, when a component specification sheet indicates that the output range of a component is −128 to 127, and the component provides the values of A, then $\max(|A(:)|)$ is 128. As a further example, when bench testing indicates that the value of A during normal operation is between −5 and 125, then $\max(|A(:)|)$ can be estimated as 125.

In some fixed-point embodiments, based on EQ. 2, the appropriate number of bits for computing R may be:

$$\text{ceil}(\log_2(\alpha \cdot \beta \cdot \max(|A(:)|))) \qquad \text{(EQ. 4)}$$

where $\alpha$ is a scaling factor dependent on a gain associated with the QR decomposition method. As a non-limiting example, when using Givens rotations and CORDIC implementations of QR decomposition, the gain may be approximately 1.6468. In some embodiments, $\beta$ may be $\sqrt{m}$. In some embodiments, a number of bits $x=\text{ceil}(\log_2(\alpha \cdot \beta))$ may be added to the number of bits used to represent A (e.g., the fixed-point word length of A may be increased by x bits) to prevent overflow of R.

In some fixed-point embodiments, based on EQ. 3, the appropriate number of bits for computing c may be:

$$\text{ceil}(\log_2(\alpha \cdot \beta \cdot \max(|b(:)|))) \qquad \text{(EQ. 5)}$$

where $\alpha$ is a scaling factor dependent on a gain associated with the QR decomposition method. As a non-limiting example, when using Givens and CORDIC implementations of QR decomposition, the gain may be approximately 1.6468. In some embodiments, $\beta$ may be $\sqrt{m}$. In some embodiments, a number of bits $\tau=\text{ceil}(\log_2(\alpha \cdot \beta))$ may be added to the number of bits used to represent b (e.g., the fixed-point word length of b may be increased by $\tau$ bits) to prevent overflow of c.

The magnitude of the largest element in the vector x, where $x=R\backslash c$ ("\" being the matrix left division operator, which can be the solution $Rx=c$ when the solution exists and R is a square matrix or the least-squares solution to $Rx=c$ when R is a rectangular matrix), can depend on the number of rows in A, the magnitude of the largest element in b, and the magnitude of the smallest singular value of A (e.g., $s_{min}(A)$):

$$\max(|x(:)|) = \|x\|_\infty \qquad \text{(EQ. 6)}$$
$$\max(|x(:)|) \leq \|x\|_2$$
$$\max(|x(:)|) \leq \|R^{-1} \cdot (Q'b)\|_2$$
$$\max(|x(:)|) \leq \|R^{-1}\|_2 \|(Q'b)\|_2$$
$$\max(|x(:)|) \leq \frac{\sqrt{m} \max(|b(:)|)}{s_{min}(A)}$$

The bound in EQ. 6 depends on the magnitude of $s_{min}(A)$. This bound can be determined based on the equivalence between $s_{min}^2(A)$ and the smallest eigenvalue of the n-by-n matrix $A'A$. Each of the elements of $A'A$ can be modeled as a signal plus noise. In some embodiments, the noise may be Gaussian noise or be a noise suitable for modeling as Gaussian noise, with or without transformation (e.g., one or a combination of at least two of thermal noise, quantization noise, pink noise, shot noise, burst noise, or some other noise present in an electrical or electromechanical device). Quantization noise may be quantization error introduced by quantization in conversion of analog signals to digital signals. Thermal noise may be noise arising from the thermal motion of charge carriers. A value for the noise (e.g., a noise value) may be or include a noise power, standard deviation of the noise, variance of the noise, distribution of the noise, one or more moments of the distribution of the noise, or the like. For convenience of explanation, the examples provided herein use a noise power, but the disclosed embodiments are not so limited.

In various embodiments, the noise for each element of $A'A$ may be or be modeled as being independent and identically distributed. Consistent with this model, the noise will generally give rise to the smallest eigenvalue of $A'A$. Accordingly, the smallest eigenvalue of $A'A$ can be a random value with a probability density function dependent on the dimensions of A and the characteristics of the noise (e.g., in some embodiments, the variance or power of the noise).

The probability density function $f_{\lambda_{min}}(x)$ of the standardized (e.g., assuming zero-mean unit-variance Gaussian noise) smallest eigenvalue x of a real-valued A'A matrix satisfies the relationship:

$$L_{m,n} e^{-\frac{n}{2}x} x^{\frac{1}{2}(m-n-1)} \leq f_{\lambda_{min}}(x) \leq L_{m,n} e^{-\frac{x}{2}} x^{\frac{1}{2}(m-n-1)}$$

where $$L_{m,n} = \frac{2^{\frac{m-n-1}{2}} \Gamma\left(\frac{m+1}{2}\right)}{\Gamma\left(\frac{n}{2}\right)\Gamma(m-n+1)}$$

where $\Gamma$ is the gamma function. By integrating the upper bound on the probability density function $f_{\lambda_{min}}(x)$ over 0 to $\lambda$, an upper bound on the cumulative probability density function $P(\lambda_{min} \leq \lambda)$ can be determined:

$$P(\lambda_{min} \leq \lambda) = \frac{2^{m-n}\Gamma\left(\frac{m+1}{2}\right)\Gamma\left(\frac{m-n+1}{2}\right) - \Gamma\left(\frac{m-n+1}{2}, \frac{\lambda}{2}\right)}{\Gamma\left(\frac{n}{2}\right)\Gamma(m-n+1)} \quad \text{(EQ. 7)}$$

Thus, a probability bound on the value of the standardized smallest eigenvalue for a real-valued A'A matrix can be determined.

Similarly the probability density function $f_{\lambda_{min}}(x)$ of the standardized (e.g., assuming zero-mean unit-variance gaussian noise) smallest eigenvalue x of a complex-valued A'A matrix satisfies the relationship:

$$L_{m,n} e^{-\frac{n}{2}x} x^{(m-n)} \leq f_{\lambda_{min}}(x) \leq L_{m,n} e^{-\frac{x}{2}} x^{(m-n)}$$

where $$L_{m,n} = \frac{\Gamma(m+1)}{2^{m-n-1}\Gamma(n)\Gamma(m-n+1)\Gamma(m-n+2)}$$

where $\Gamma$ is the gamma function. By integrating the upper bound on the probability density function $f_{\lambda_{min}}(x)$ over 0 to $\lambda$, an upper bound on the cumulative probability density function $P(\lambda_{min} \leq \lambda)$ can be determined:

$$P(\lambda_{min} \leq \lambda) = \frac{\Gamma(m+1)(\Gamma(m-n+1) - \Gamma(m-n+1,\lambda))(m-n+1)}{\Gamma(n)\Gamma(m-n+2)^2} \quad \text{(EQ. 8)}$$

Thus, a standardized eigenvalue for a complex-value A'A matrix can be determined.

Accordingly, given the dimensions of matrix A and an overflow probability $\rho$, a standardized smallest singular value for matrix A can be computed as the square root of $\lambda$, which can be determined using either EQ. 7 or EQ. 8, depending on whether matrix A is real-valued or complex-valued. A bound on smallest singular value $s_{min}(A)$, assuming noise with power $\sigma^2$, can be determined by scaling the standardized smallest singular value (e.g., square root of $\lambda$) using the noise power:

$$s_{min}(A) \leq \sigma \cdot \sqrt{\lambda} \quad \text{(EQ. 9)}$$

when A is real-valued, or $$s_{min}(A) \leq \sigma \cdot \sqrt{\frac{\lambda}{2}} \quad \text{(EQ. 10)}$$

when A is complex-valued.

In some fixed-point embodiments, based on EQ. 6 and EQS. 9 or 10, the appropriate number of bits for computing x may be:

$$\text{ceil}(\log_2(\alpha \cdot \gamma \cdot \max(|b(:)|))) \quad \text{(EQ. 11)}$$

where $\alpha$ is a scaling factor dependent on a gain associated with the QR decomposition method. As a non-limiting example, when using Givens rotations and a CORDIC implementations of QR decomposition, the gain can be approximately 1.6468. In some embodiments, $\gamma$ can be $\sqrt{m}/s_{min}(A)$ when b is real-valued and $\sqrt{2m}/s_{min}(A)$ when b is complex-valued. In some embodiments, a number of bits $n=\text{ceil}(\log_2(\alpha \cdot \gamma))$ may be added to the number of bits used to represent b (e.g., the fixed-point word length of b can be increased by n) to prevent overflow of x.

In some embodiments, using EQS. 7 to 10, any one of the design parameters (e.g., $\max(|x(:)|)$, $\max(|b(:)|)$, $\beta$, m, n, $\lambda$, $\sigma^2$, $\alpha$, $\gamma$, and $\rho$) may be expressed in terms of the remaining design parameters. For example, the relationship between $\rho$ and $\lambda$ can be plotted, and the $\lambda$ corresponding to a selected overflow probability $\rho$ can be determined. The corresponding $\lambda$ can be used to determine the maximum range of the vector x in terms of the maximum range of the vector b and the number of rows of A. The maximum range of the vector x can then be used to select a datatype for the device. Likewise, the effect of using a different method of QR decomposition on the $\rho$ can be modeled by replacing a scaling factor of $\alpha=1.6468$ with a scaling factor value appropriate for the new method. Similarly, the effect of acquiring more observations (e.g., increasing m) or observations including more measurements (e.g., increasing n) on the minimum system noise power $\sigma^2$ can be determined.

In some embodiments, EQS. 7 to 10 may be used to estimate a condition number of matrix A. The condition number can be used to estimate the change in vector x given a change in vector b. The condition number can be:

$$k(A) = \|A\|\|A^{-1}\|$$

$$k(A) = s_{max}(A)/s_{min}(A)$$

where $s_{max}(A)$ is the largest singular value of A. The largest singular value of A can be assumed or estimated using methods known to those of skill in the art. The maximum change in x given the smallest assumed change in b can then be estimated as:

$$\Delta x = k(A)\Delta b$$

The necessary precision of x can then be estimated based on the maximum change in x.

In some real-time applications, observations can be received continuously. For example, when A includes rows representing observations and columns representing measurements (e.g., when A represents observations received from a radar array), new rows of A can be continuously received. In some embodiments, rather than re-computing the entire economy-sized QR decomposition of matrix A after each observation is received, the economy-sized QR decomposition of matrix A can be updated using the new row. For example:

$$\begin{bmatrix} \varepsilon R_t \\ A(t+1, :) \end{bmatrix} \rightarrow \begin{bmatrix} R_{t+1} \\ 0 \end{bmatrix}$$

where $R_t$ is the n-by-n upper-triangular matrix computed at time t. To compute the n-by-n upper-triangular matrix $R_{t+1}$ for time t+1, $R_t$ can be multiplied by forgetting-factor $\varepsilon$ and measurement row vector A(t+1, :) (where the use of the colon operator ":" alone specifies all the elements in a dimension), obtained at time t+1, can be appended to $\varepsilon R_t$. Row operations can be performed to zero out A(t+1,:), thereby factoring the information contained in A(t+1, :) into $R_{t+1}$. The forgetting factor $\varepsilon$ prevents the values of R from growing without bound. When R is updated indefinitely using the forgetting factor the resulting increase in magnitude in R is:

$$g = \sqrt{\frac{1}{2}\int_0^\infty \varepsilon^x dx} = \sqrt{\frac{-1}{2\log \varepsilon}}$$

In addition, in the case where R is computed from a fixed-size m-by-n matrix A without a forgetting factor, updating R can result in a gain of $\sqrt{m}$. Setting $$\sqrt{m} = \sqrt{\frac{-1}{2\log \varepsilon}}$$

enables the forgetting factor to be expressed in terms of the effective number of rows in the matrix:

$$\varepsilon = e^{-1/2m} \quad \text{(EQ. 12)}$$

Given a maximum desired growth, which is a function of the minimum singular value, which is a function of m, the required forgetting factor $\varepsilon$ can be determined.

The disclosed embodiments can improve upon conventional design techniques for devices configured to solve EQ. 1. For example, using EQ. 5 or EQ. 6 (depending on whether A'A is real- or complex-valued), an architect, developer, engineer, or other user (e.g., a "designer") can determine the effect of changing or choosing one of the design parameters on the remaining design parameters (e.g., the effect of changing the size of A by changing the number of samples acquired on the size of the variables used to compute the QR decomposition), without extensively simulating device performance. In some instances, design parameters can be determined using EQS. 5 or 6 without simulating device performance. The total number of simulations performed during the design process can therefore be reduced or eliminated, reducing the time and resources required to design the device and increasing the flexibility of the design process. Furthermore, the disclosed embodiments can enable the designer to select the simplest, cheapest, or best-performing hardware having an acceptable overflow probability (e.g., based on the datatypes supported by the hardware). Thus, the disclosed embodiments can enable reductions in device complexity and cost and improvements in device performance.

In some embodiments, the design process may still include some simulation of device behavior. In some instances, simulations may be used to verify that a design achieves desired device behavior. In various instances, simulations may be used to determine the effect of a choice or a change of a design parameter on other components of a larger system. In some instances, another device or system may consume the output of the device being designed. The behavior of the device may be simulated to determine the effect of the choice or the change of a design parameter on this downstream system. For example, when the device is an adaptive beamformer, the downstream system may be an automatic target acquisition system that detects and acquires targets using electromagnetic signals obtained by an antenna array and filtered by the adaptive beamformer. During design of an overall system including the adaptive beamformer and the automatic target acquisition system, the behavior of the adaptive beamformer may be simulated to determine the effect of design parameter choices or changes on the automatic target acquisition system. Alternatively or additionally, the adaptive beamformer may be simulated to generate realistic inputs (e.g. filtered antenna signals) for the design, analysis, or verification of the automatic target acquisition system. In some embodiments, the disclosed relationships between design parameters can be used to determine initial starting values for simulating device performance. By initializing the simulation with values for datatype and overflow probability that are consistent with each other, the disclosed embodiments may reduce the number of simulations needed to verify or validate the performance of a model.

In some embodiments, EQ. 1 may represent a system of differential equations. The differential equations may be partial differential equations, such as those arising in acoustics, fluid dynamics, electrodynamics, heat transfer, or the like. The partial differential equations can be linear differential equations, such as the heat equation, the wave equation, Laplace equation, Helmholtz equation, Klein-Fock-Gordon equation, Poisson equation, or the like. The mechanical, electrical, thermal, or material handling properties of devices, components, or structures may be governed by such systems of differential equations.

A computing device configured to model the properties of a device, component, or structure can solve such a system of differential equations using known finite element analysis methods. The computing device can partition the model using a mesh and approximate the system of differential equations of over each partition using, in part, a matrix equation including a stiffness matrix. The disclosed embodiments can enable the computing device to determine a bound on the smallest singular value of the stiffness matrix.

The computing device can use the smallest singular value bound to select an appropriate datatype for solving the matrix equation, as described herein. Among datatypes having an acceptable overflow probability, the computing device may select the datatype that uses the least memory. In this manner, the disclosed embodiments may reduce the memory required to perform the finite element analysis. Additionally or alternatively, the computing device can use the smallest singular value bound to determine whether to adjust the mesh partitioning the model. The bound can be used to determine a precision or error involved in the finite element analysis. When the precision of the analysis is too low or the error too high, the mesh may be adjusted (e.g., automatically by the computing device, manually by a user of the computing device in response to information provided by the computing device, or the like) to reduce the size of one or more partitions of the model. In this manner, the disclosed embodiments may reduce the memory usage associated with finite element modeling and increase the precision and reduce the error of such modeling. By improving finite element modeling, the disclosed embodiments can benefit a designer using such modeling.

In some embodiments, the differential equations can be ordinary differential equations. The ordinary differential equations can include one or more mathematical functions of an independent variable and the derivatives of those mathematical functions. The ordinary differential equations can be linear ordinary differential equations, specified by linear polynomials of functions and derivatives of the functions. Such a system of linear ordinary differential equations can be represented in a state space form that includes a state matrix characterizing the system of linear ordinary differential equations. Alternatively, the ordinary differential equation can be a non-linear ordinary differential equation that has been linearized around a point (e.g., an operating point, or the like), consistent with known methods, to generate a linear ordinary differential equation that approximates the behavior of the non-linear ordinary differential equation near the point. Operations involving the linear ordinary differential equation or the linearized version of the non-linear ordinary differential equation (e.g., simulating the time evolution of a system governed by the system of ordinary differential equations) may involve solving a matrix equation involving the state matrix.

A computing device can be configured to simulate the behavior of a system (e.g., an aileron design, a boat hull, a control system for an aileron, a control system for a robot arm, or the like) governed by ordinary differential equations. Such simulation may be used during design or validation of the system to evaluate system behavior or performance. The disclosed embodiments can be used to select datatypes for use by the system or for use in simulating the system. The datatypes may be selected, as described herein, by determining a bound on the smallest singular values of the matrix. In some embodiments, the bound on the smallest singular value can be used to determine a range of values of the output (or input) given the input (or output) range. In various embodiments, the bound can be used to determine a condition number of the matrix, which can be used, according to known methods, to determine a precision of the solution to the matrix equation. In this manner, the disclosed embodiments may reduce the memory usage associated with such simulations and allow designers to consider the tradeoffs between design parameters, as described herein, without requiring extensive (or any) simulations.

Implementation in a Design Environment

The disclosed systems and methods can be implemented in a design environment. Consistent with disclosed embodiments, the design environment can select, recommend, or validate choices of datatypes used by a model or used in code generated from the model. In some embodiments, the selection of components or models elements for use in the model may affect the datatypes used by the model or used by code generated from the model. For example, a design environment may support both floating-point components and fixed-point components. Adding a floating-point component to a model in such a design environment may cause the model to use floating-point datatypes. Accordingly, the design environment can select, recommend, or validate choices of components or model elements used by a model or used in code generated from the model. In some implementations, such selection, recommendation, or validation can be performed based at least in part on information provided by the user. In various implementations, the design environment can be configured to provide a report documenting the selected or recommended datatypes. The report can indicate the variables and components. In some implementations, the report can indicate the assumptions (e.g., design parameters or the like) supporting the selection or recommendation of the datatypes.

In some embodiments, the design environment can be configured to generate a datasheet (or information suitable for inclusion in a datasheet) for a model or a device configured to implement the model. For example, the design environment can be configured to generate plots depicting, for example, the minimum noise value as a function of overflow probability, A matrix dimensions, or other design parameters; the overflow probability as a function of minimum noise value, A matrix dimensions, or other design parameters; or other depictions of relationships between values or ranges of values for two or more design parameters.

A design environment configured to support the disclosed embodiments may enable determination of a suitable hardware for implementation of a model, given the model; determination of a model, given hardware for implementing the model; or a combination approach in which changes to the hardware inform changes to the model (and vice versa) in an iterative process. In this manner, such a design environment may enable design of devices configured to solve EQ. 1 without relying on simplifying assumptions or requiring extensive simulations. The user therefore benefits from a more flexible design process, potentially enabling the design of less-complex, better-performing devices.

The disclosed embodiments are not limited to embodiments implemented in a design environment. The disclosed embodiments may also be provided as an extension of or complement to a design environment. In some instances, the disclosed embodiments may be provided separately from a design environment (e.g., as a stand-alone tool or the like). In such implementations, the disclosed embodiments can be used to validate or recommend changes to independently-developed models (e.g., models developed in a separate design environment).

Consistent with disclosed embodiments, the design environment can obtain values for at least some of the design parameters described above with regards to EQS. 7 to 10 (e.g., max(|x(:)|), max(|b(:)|), $\beta$, m, n, $\lambda$, $\sigma^2$, $\alpha$, $\gamma$, and $\rho$, or the like). In some instances, the design environment can receive values for one or more of the design parameters from a user (e.g., through user interactions with a user interface of the design environment). In various instances, the design environment can be configured with a default value for one or more of the design parameters (e.g., the design environment can be configured with a default overflow probability $\rho=3\times10^{-7}$, a noise power $\sigma^2$ of $-100$ dBm, or the like). In some instances, the design environment can retrieve values for one or more of the design parameters from a configuration file (e.g., a model configuration set; a logical workspace, which may be global or local to a level in a decomposition hierarchy; a Data Dictionary; csv file; or the like), a component definition (e.g., a word-length parameter of a fixed-point finite-impulse-response block), or user-provided program code, such as a script or a function, or the like.

The design environment can determine values for one or more design parameters using the obtained design parameter values (or a subset of the obtained design parameter values). In some instances, for example, the design environment can determine a maximum output value max(|x(:)|) given a maximum input value max(|b(:)|), the dimensions of matrix A, whether A is real- or complex-valued, a minimum noise power in the values of A, the type of QR decomposition performed, and an overflow probability. Additionally, when the type of QR decomposition is specified, the design environment can determine the maximum value of each intermediate variable used in performing the QR decomposition. In this manner, the design can determine the datatypes to use in performing the QR decomposition.

In some embodiments, the design environment can identify inconsistencies between obtained design parameter values. In some instances, the design environment can determine whether the obtained overflow probability value (e.g., a default value, a value received from a user, a value retrieved from a configuration file, or the like) is less than the overflow probability value calculated from other obtained parameters. For example, the design environment can determine an overflow probability value given a maximum output value max(|x(:)|), a maximum input value max(|b(:)|), the dimensions of matrix A, whether A is real- or complex-valued, a minimum noise power in the values of A, and the type of QR decomposition performed (e.g., using EQS. 7 to 10). The design environment can determine whether this calculated overflow probability value exceeds the obtained overflow probability value. The design environment can provide an indication to the user when the calculated overflow probability value exceeds the obtained overflow probability value. Such an indication may cause the user to reconsider or revisit the design choices leading to this inconsistency.

In various embodiments, the design environment can automatically determine whether design parameter values provided by the user satisfy an overflow probability criterion (e.g., a requirement that an overflow probability value calculated from the provided design parameter values be less than a threshold value, such as 0.000339%). The design environment can perform this determination using EQS. 7 to 10. The overflow probability criterion may be predetermined or user-specified. The design environment can provide an indication to the user when the overflow probability criterion is not satisfied. Such an indication may cause the user to reconsider or revisit the selected design parameter values.

In various embodiments, the design environment can be configured to provide a report documenting the relationship between two or more of the datatype, input or output range, A matrix dimension, noise power, or overflow probability. In response to a user interaction, the report may be displayed to the user in a graphical user interface, stored (e.g. in a non-transitory computer-readable storage medium or exported to a file), or printed. In this manner, the design environment can document that a selection of design parameters does (or does not) achieve design goals or requirements.

In some embodiments the design environment can be configured to provide feedback to the user regarding the design parameters. In some instances, the design environment can be configured to indicate a change one or more parameters capable of resolving an inconsistency between design parameters (e.g., would cause a specified overflow probability to match an overflow probability calculated from the remaining design parameters, or the like). In some instances, for example, the design environment can be configured to indicate one or more of an increase in the number of A matrix rows, a decrease in the number of A matrix columns, an increase in the minimum system noise, a change in datatype, or a similar change in the model parameters that would resolving an inconsistency between design parameters. In various instances, the design environment can be configured to indicate a robustness of a set of design parameters. In some instances, for example, the design environment can provide an indication of one or more ranges for one or more respective design parameters, given the values of the remaining design parameters. In some instances, for example, the design environment can be configured to indicate a maximum possible decrease in the number of A matrix rows, increase in the number of A matrix columns, decrease in the minimum system noise, or a similar design parameter change, that could occur without creating an inconsistency in the design parameters. In some instances, the design environment can provide a qualitative indication of the robustness of the design parameters. For example, the design environment could display a green check mark or other symbol to indicate that any design parameter could deviate 10% from a specified value without creating an inconsistency. In contrast, the design environment could display a red X or other symbol to indicate that there exists at least one design parameter for which a deviation of 10% would create an inconsistency.

Exemplary Application: Designing an Adaptive Beamformer

FIG. 1A depicts an exemplary design environment including a model 100, consistent with disclosed embodiments. The design environment can be supported by a visual programming or design language. The design environment can support graphical model, textual models, or hybrid graphical/textual models. The design environment can provide one or more user interfaces, including a design canvas. A designer can interact with the design environment to create model 100 by placing and connecting components in the design canvas.

Model 100 may be created during the process of designing an adaptive beamformer (e.g., a beamformer configured to weight signals received from an array of sensors based on the statistics of the received data). The disclosed embodiments are not limited to models relating to adaptive beamformers. The design process can include choosing an implementation of one or more components of model 100. Such components can be implemented using hardware, software, or a mix of hardware and software. In some embodiments, such components can be implementable using software running on a computer or a device such as a programmed field-programmable gate array (FPGA), application-specific integrated circuit (ASIC), digital signal processor (DSP), central processing unit (CPU), graphical processing unit (GPU), or similar component. The design environment can support datatype selection or recommendation, consistent with disclosed embodiments. A user may choose a particular implementation of the adaptive beamformer (e.g., particular hardware or software components, a particular mix of hardware and software, or the like), based on the selections or recommendations provided by the design environment.

Model 100 represents a system in which an antenna array (represented by antenna 110) transduces electromagnetic waves into voltage signals that are provided to the adaptive beamformer. The voltage signals may be noisy, potentially including one or more signals of interest (e.g., a communications signal, a reflected radar signal, or the like), interference (e.g., a jamming signal), and system noise (e.g., thermal noise, quantization noise, or the like in the antenna). The adaptive beamformer may contribute additional noise to the voltage signals. The adaptive beamformer can combine weighted versions of the input voltage signals to generate an output signal. In weighting and combining the input voltage signals, the adaptive beamformer can be configured to detect or preserve the signal of interest while attenuating the interference and system noise. In this example, the output signal is passed to beamformer output 130, which displays the output signal. A designer might use model 100 to investigate the performance of an adaptive beamformer (e.g., as part of a radar system in which other components use the signal of interest to determine the location of a detected object). Consistent with disclosed embodiments, the design environment may select or validate one or more design parameters of the adaptive beamformer, given other design parameters (e.g., as described above with respect to EQS. 7 to 10). As design parameters may arise from model choices or hardware choices, a design environment consistent with disclosed embodiments may be used to select hardware suitable for implementing a given model, select model characteristics suitable for implementation on given hardware, or support an iterative design approach in which model choices inform hardware choices (and vice versa).

Antenna or antenna array 110 (for simplicity, antenna 110 is used herein) can be a component configured to provide sensor data to beamformer component 101. The sensor data can be generated by antenna 110 (e.g., in response to an input signal specified by the designer) or loaded, replayed, or streamed by antenna 110 (e.g., using real-world data acquired by a real-world antenna array and stored for subsequent access by, or streamed to, antenna 110). Antenna 110 can be a model of or represent an array of antennas having a particular composition and spatial arrangement. For example, antenna 110 can represent a 10-element uniform linear array, with each element being an isotropic antenna. In a non-limiting example, antenna 110 can be configured to provide the sensor data to beamformer 101 as a vector of values for each time-step in a simulation. For ease of explanation, antenna 110 depicts a plot of the output data of one of the antenna elements. This depiction is not intended to be limiting.

In some embodiments, during a simulation, antenna 110 can generate sensor data representing voltage signals. The sensor data can contain or be combined with noise, representing thermal noise, discretization noise, quantization noise, or another noise source described herein. Sometimes the noise may be of comparable amplitude to the signal. For example, as depicted in FIG. 1A, signal input 111, a 2-volt step signal input occurring at 200 ms (e.g., signal input 111) may not be discernable in the output of an antenna element because of the noise in the signal.

Signal angle 120 can provide signal angle values to the signal angle input Ang of beamformer 101. For example, signal angle 120 can provide an array with values [40; 0], where the value in the first row of the array specifies the azimuth angle and the value in the second row of the array specifies an elevation of the source of the signal of interest relative to the antenna array. Signal angle 120 can be constant or can vary. In some embodiments, signal angle 120 can be configured by the designer developing the adaptive beamformer to provide particular signal angle values during simulation. The particular signal angle values provided may depend on the intended use of the adapted beamformer being developed (e.g., signal angle values for an adaptive beamformer intended for use in a GPS device may point to the expected location of a GPS satellite).

Beamformer 101 can represent a minimum variance distortionless response (MVDR) beamformer. Beamformer 101 can be configured to use the values provided by signal angle 120 to generate an adaptive spatial filter that transmits signals arriving at the specified signal angle, while attenuating noise or interference signals arriving at other angles. Beamformer 101 can include a sensor input (X), a sensor angle input (Ang), and a beamformer output (Y). Additional parameters of the model (e.g., sample rate or operating frequency) can be accessed or manipulated by the designer, for example by selecting beamformer 101. The sensor input (X) can be connected to antenna 110. During simulation, beamformer component 101 can receive the output of antenna 110. The sensor angle input can be connected to signal angle 120. During simulation, in this example, beamformer component 101 can receive the constant or varying values of the signal angle 120.

Beamformer 101 can be configured to determine a set of weights for processing the output of antenna 110 using signal angle 120. The set of weights can be determined before or during simulation. In particular, beamformer 101 can be configured to generate a scalar output Y(t) (e.g., the beamformer output) at time t from an n-by-1 vector of sensor inputs X(t) using an n-by-1 vector of weights W(t):

$$Y(t)=W'(t)X(t)$$

The vector of weights W can be determined from an n-by-m matrix A of past sensor samples:

$$A=[X(t-m), X(t-(m-1)), \ldots, X(t-1)]'$$

The sensor angle input (Ang) can be used to generate an n-by-1 steering vector, V. The elements of V can be complex exponentials constructed so that $\max(|V(:)|)=1$. Weights vector W can then be expressed as:

$$W(t) \approx \frac{(A'A)^{-1}V}{V'(A'A)^{-1}V}$$

A design environment (or a tool independent of the design environment) can be configured to implement the disclosed embodiments to select, recommend, or validate one or more datatypes for use in implementing beamformer 101 (e.g., the model of the adaptive beamformer) in hardware, software, or a combination of hardware and software, consistent with disclosed embodiments. Additionally or alternatively, given a selection of hardware (which may constrain the datatypes used in implementing beamformer 101), such a design environment can be configured to select, recommend, or validate characteristics of beamformer 101 (e.g., the model of the adaptive beamformer), such as the number of columns (e.g., number of antennas) and number of rows (e.g., number of observations for each antenna) in matrix A.

In some embodiments, the disclosed embodiments can be used in the design process by a designer of a beamformer. The designer can simulate the behavior or functionalities of a model beamformer. The designer can modify the parameters of the model to obtain the desired behavior or functionalities. The designer can use the disclosed embodiments to determine necessary characteristics of the hardware implementation of the model beamformer (e.g., the hardware must be capable of performing k-bit fixed point operations, where k is determined by the disclosed systems and methods based, in part, on the model of the beamformer). The designer may then generate code from the model and deploy the code onto the selected hardware to configure the hardware to implement the model as designed.

Signal angle filter 103 depicts a plot of transmitted signal power versus azimuth angle for a given set of weights W(t). In this non-limiting example, the single angle is 40 degrees, and interference signals are present at 30 and 50 degrees. When multiplied by the sensor inputs X(t), the weights vector W(t) does not attenuate signals arriving at an azimuth angle of 40 degrees (e.g., signal angle 141), but strongly attenuates signals arriving at 30 and 50 degrees (e.g., interference angles 143).

Beamformer output 130 can be a model component configured to receive the output of beamformer 101. Beamformer output 130 can be configured to store, analyze, or display (e.g., as shown) or stream the output received from beamformer 101. As shown in FIG. 1A, due to the weights selected by beamformer 101 even though signal input 111 is not discernable in the output received from an antenna element, corresponding signal output 131 can clearly be observed in beamformer output 130.

When $(A'A)^{-1}$ exists, $$W(t) \approx \frac{l}{\delta},$$

where $l=(A'A)^{-1}V$ and the scalar $\delta=(V'(A'A)^{-1}V)$. Beamformer 101 can therefore solve the equation $(A'A)l=V$, an equation in the form of EQ. 1, when determining weights vector $W(t)$. Consistent with disclosed embodiments, the design environment can determine the relationship between design parameters of beamformer 101, such as the maximum value of l or $\delta$, the dimensions of matrix A, whether A is real- or complex-valued, noise power (e.g., in sensor inputs $X(t)$), and the overflow probability for use in determining the smallest singular values of A. As described herein, the relationship between these design parameters may depend on the method used to solve the equation $(A'A)l=V$. The designer can use the relationships determined by the design environment to select hardware components based on a selected configuration of beamformer 101, select a configuration of beamformer 101 based on a selection of hardware components, or iteratively update both the selected hardware components and the configuration of beamformer 101. Thus, the design environment can enable a designer to select components for implementing beamformer 101 without requiring extensive simulation, and better strike the correct balance between hardware capabilities and model specifications.

As a non-limiting example, the equation $(A'A)l=V$ can be solved through economy-sized QR decomposition of A:

$$A'Al=V$$

$$(QR)'(QR)l=V$$

$$R'Q'QRl=V$$

$$R'Rl=V$$

where R is an n-by-n upper triangular matrix and Q is a unitary matrix such that $Q'Q$ equals the identity matrix. Then:

$$Rl=R'\backslash V$$

$$l=R\backslash(R'\backslash V) \quad \text{(EQ. 12)}$$

In some embodiments, R may be initially or repeatedly determined using a batch of sensor samples. In various embodiments, R may be continuously updated using new sensor samples as they are acquired. When R is continuously updated, a forgetting factor may be selected by the designer or design environment. The forgetting factor may be selected to establish an effective number of rows, as described above with regards to EQ. 12. This effective number of rows can be used to determine the bounds on the minimum singular values of A.

The solution of EQ. 12 can occur in two steps. First, $y=R'\backslash V$ can be found through forward substitution, as R' is a lower triangular matrix. By EQ. 6:

$$\max(|y(:)|) \leq \frac{\sqrt{n} \max(|V(:)|)}{s_{min}(A)} = \frac{\sqrt{n}}{s_{min}(A)} \quad \text{(EQ. 13)}$$

Then $l=R\backslash y$ can be found through backward substitution, as R is an upper triangular matrix.

$$\max(|l(:)|) \leq \frac{\sqrt{n} \max(|y(:)|)}{s_{min}(A)} \leq \frac{\sqrt{n}}{s_{min}(A)} \cdot \frac{\sqrt{n}}{s_{min}(A)} = \frac{n}{s_{min}(A)^2} \quad \text{(EQ. 14)}$$

$\delta$ can be bounded as follows:

$$\|V'R\backslash(R'\backslash V)\|_\infty \leq \|V'\|_\infty \|R^{-1}\|_\infty \|R'^{-1}\|_\infty \|V\|_\infty \quad \text{(EQ. 15)}$$

$$\|V'R\backslash(R'\backslash V)\|_\infty \leq \|R^{-1}\|_\infty \|R'^{-1}\|_\infty$$

$$\|V'R\backslash(R'\backslash V)\|_\infty \leq \sqrt{n}\|R^{-1}\|_2 \sqrt{n}\|R'^{-1}\|_2$$

$$\|V'R\backslash(R'\backslash V)\|_\infty \leq \frac{n}{s_{min}(A)^2}$$

As shown above, intermediate components $W(t)$ (e.g., y, l, and $\delta$) can be bounded using EQ. 13 to 15. These bounds depend on the minimum singular value of A. The minimum singular value of A can be determined, for a given overflow probability, using EQ. 7 and 9 or 8 and 10, depending on whether A is real- or complex-valued.

Accordingly, consistent with disclosed embodiments, the design environment can be configured to automatically determine numerical range bounds on y, l, and $\delta$, given the dimensions of matrix A, a system noise having power $\sigma^2$, and an overflow probability p. In some embodiments, the design environment can obtain at least one of the dimensions of matrix A, the noise power $\sigma^2$, or the overflow probability $\rho$ from at least one of the user, model 100 or a component of model 100 (e.g., antenna 110 or beamformer 101), from a default value, from a configuration file, or the like. The design environment can also be configured to determine a condition number for $(A'A)$, using $s_{min}(A)^2$ and an estimate for $s_{max}(A)^2$. The estimate for $s_{max}(A)^2$ can be determined using known methods or assumed. The condition number can be used to estimate a necessary precision of l.

The design environment can be configured to select, recommend, or validate a datatype for beamformer 101, or for components of beamformer 101, based on the bounds (and in some embodiments further based on a required precision of l). Given a method of determining R, the design environment can incorporate information about that method into the selection or recommendation of the datatype. For example, when using Givens and CORDIC implementations of QR decomposition, a gain of approximately 1.6468 can be incorporated into the selection of the datatype, as described herein.

Dependence of Smallest Singular Value on Matrix Dimension

Figure 1B:
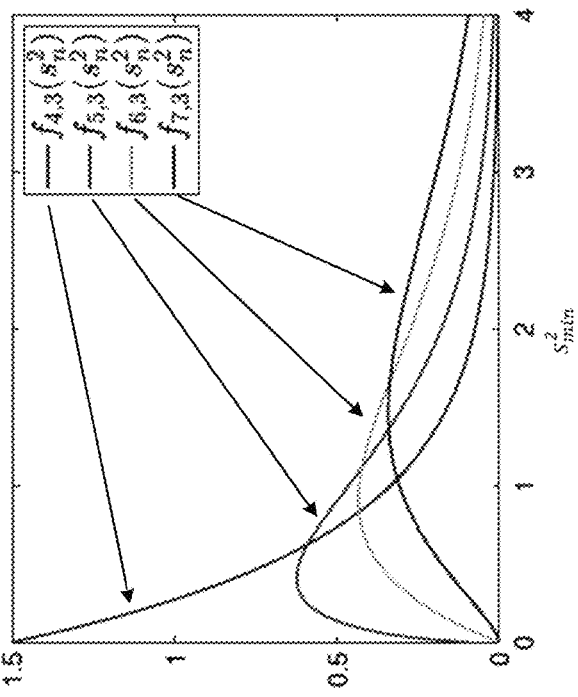
FIG. 1B depicts a dependence of the smallest squared singular value of a matrix on the number of rows and columns in the matrix, consistent with disclosed embodiments.

FIG. 1B depicts a dependence of the smallest squared singular value of a matrix (e.g., the A matrix in EQ. 1) on the number of rows and columns in the matrix, consistent with disclosed embodiments. The horizontal axis represents the smallest squared singular value and the vertical axis represent the probability per unit of smallest squared singular value. The probability density function $f_{x,y}(s_{min}^2)$ is the probability density function of the smallest squared singular value $s_{min}^2$ when matrix A has x rows and y columns. As depicted in FIG. 1B, as the number of rows of matrix A increases, the magnitude of the most-likely smallest squared singular value increases (and thus the gain in the magnitude of vector x decreases). For example, when matrix A includes five rows and three columns, the magnitude of the most-likely squared singular value of matrix A is less than 1. When matrix A includes seven rows and three columns, the magnitude of the most-likely squared singular value of matrix A is less than two and greater than one. Accordingly, as shown, increasing the number of rows of A can shift the probability density function of smallest squared singular values towards larger values. As the magnitude of the vector x in EQ. 1 depends on the smallest squared singular value of A, increasing the number of rows of A may therefore reduce the gain in vector x for a given overflow probability.

Approximation of Empirical Singular Values by Calculated Singular Values

Figure 1C:
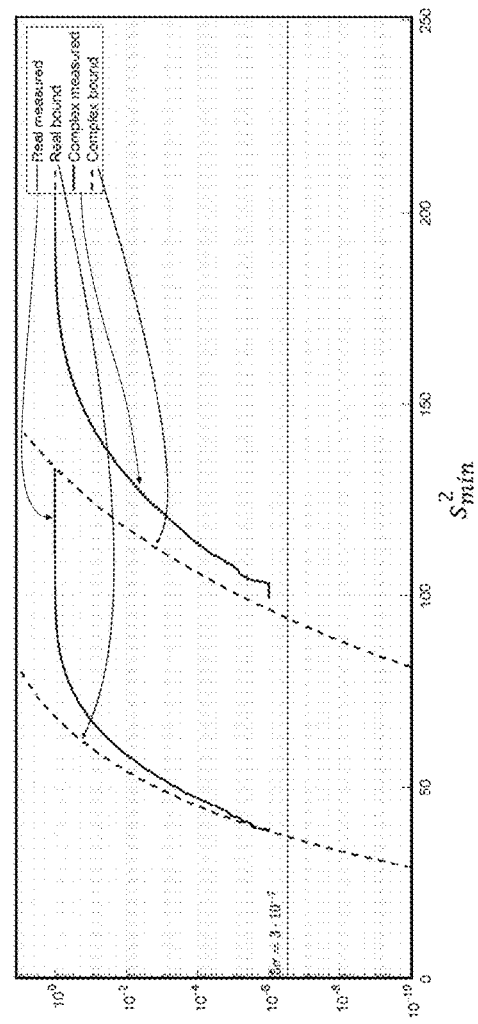
FIG. 1C depicts a comparison between empirically determined and approximate cumulative probability density functions of smallest squared singular values, consistent with disclosed embodiments.

FIG. 1C depicts a comparison between approximate and empirically determined cumulative probability density functions of smallest squared singular values, consistent with disclosed embodiments. The A matrices used were 100-row by 3-column matrices and either real- or complex-valued. FIG. 1C depicts a semi-log plot, with the independent variable being a smallest squared singular value and the dependent variable being the logarithm of the overflow probability (e.g., the probability that the smallest squared singular value of the A matrix is less than the value of the independent variable). EQ. 7 was used to determine an approximate relationship between the smallest squared singular value and the overflow probability for real-valued matrices. EQ. 8 was used to determine an approximate relationship between the squared singular value and the overflow probability for complex-valued matrices. An empirical relationship was determined for real-valued matrices using a million simulations and an empirical relationship was determined for complex-valued matrices using a million simulations.

As can be appreciated from FIG. 1C, the relationships determined by EQ. 7 and EQ. 8 approximate the relationships empirically determined through the simulations. These approximations improve as the value of the smallest squared singular value decreases. Furthermore, as can be appreciated from FIG. 1C, overflow probabilities estimated using EQ. 7 and EQ. 8 are generally greater, for each value of the smallest squared singular value, than the empirically determined overflow probabilities. Accordingly, EQ. 7 and EQ. 8 can be used to conservatively estimate the minimum squared singular value, given an overflow probability. As described herein, the estimated minimum squared singular value may be used to determine other design parameters (e.g., the datatype of variables used to solve EQ. 1, the minimum system noise, or the like).

Estimation of a Smallest Minimum Squared Singular Value

Figure 1D:
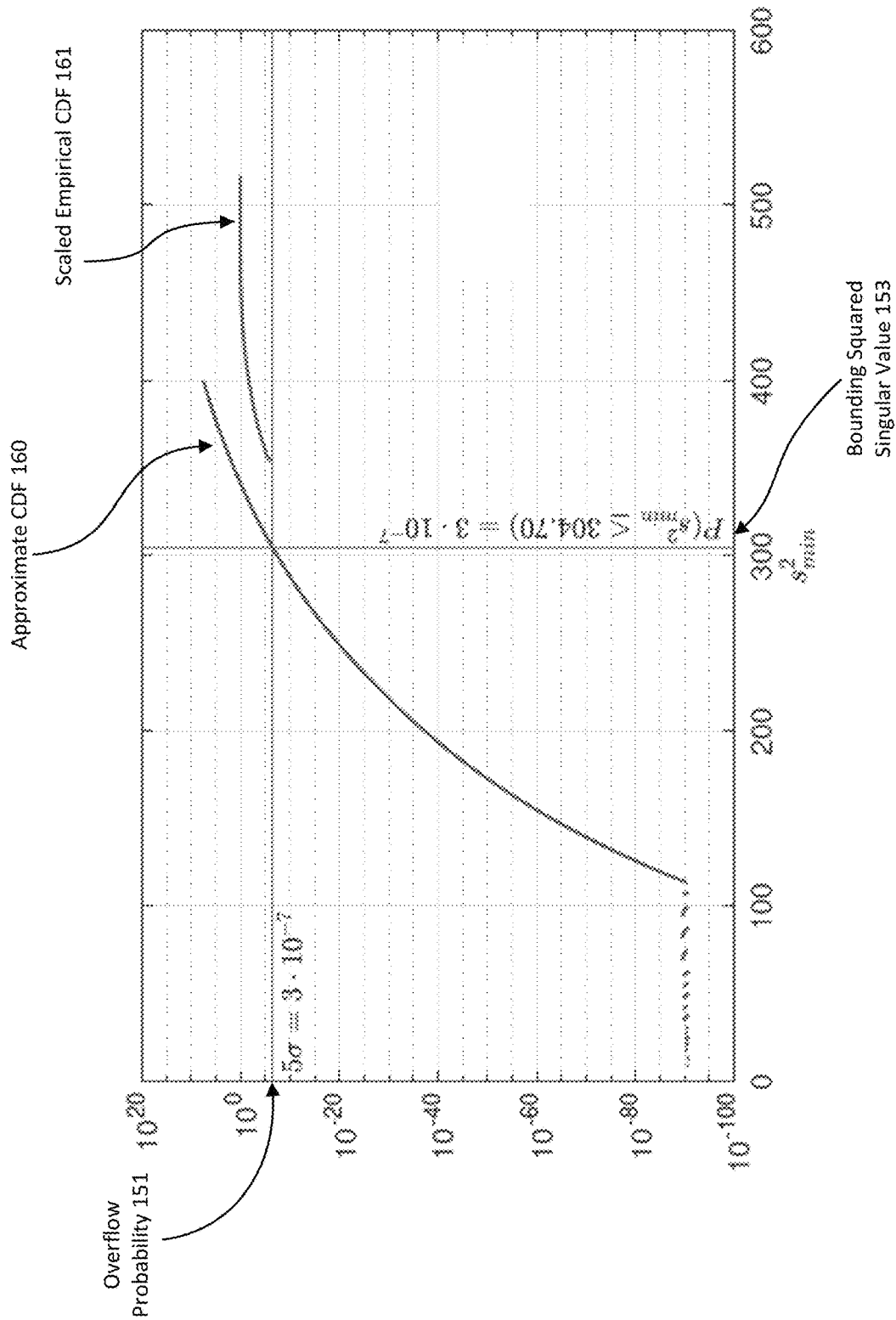
FIG. 1D depicts estimation of a smallest minimum squared singular value using an overflow probability, consistent with disclosed embodiments.

FIG. 1D depicts estimation of a smallest minimum squared singular value using an overflow probability, consistent with disclosed embodiments. The independent variable depicted in FIG. 1D is a squared singular value of a matrix (e.g., an A matrix as in EQ. 1) and the dependent variable is the logarithm of the overflow probability (e.g., the probability that the smallest squared singular value of the matrix is less than the value of the independent variable). Approximate CDF 160 was generated using EQ. 8 for a 300-row by 10-column real-valued matrix. The noise was assumed to be zero-mean, unity variance Gaussian noise. For comparative purposes, empirical CDF 161 was empirically determined using 10,000 300-row by 10-column real-valued matrices. For these trials, the noise was assumed to be Gaussian noise and the noise power was assumed to be −50 dB (e.g., $\sigma^2=10^{-5}$). As the trials were not conducted using zero-mean, unity variance Gaussian noise, the minimum squared singular values of empirical CDF 161 displayed in FIG. 1D have been normalized by the signal power using EQ. 10 (e.g., $s_{min-normalized}^2=2 \cdot s_{min-empirical}^2/\sigma^{-2}$). As shown, approximate CDF 160 provides a bound on the minimum squared singular value similar to, and more conservative than, the measured values of empirical CDF 161, without requiring 10,000 trials.

The relationship depicted in FIG. 1D can be used to estimate a minimum squared singular value, given an overflow probability. As described herein, a design environment can use this minimum squared singular value to determine datatypes of variables used to solve EQ. 1, a minimum system noise for a device configured to solve EQ. 1, or the like. As a further example, given an overflow probability, a system noise power, and the dimensions of the A matrix for an MVDR beamformer (e.g., the matrix includes rows representing observations and columns representing independent signal receivers, such as antennas or antenna elements), a design environment can determine bounds on the maximum values of $l=(A'A)^{-1}V$ and the scalar $\delta=(V'(A'A)^{-1}V)$, where the weights vector $$W(t) \approx \frac{l}{\delta}.$$

as described herein. The design environment may then determine datatypes for l, δ, and W.

As depicted in FIG. 1D, approximate CDF 160 can be used to determine a bounding squared singular value (e.g., bounding squared singular value 153), given a selected overflow probability (e.g., overflow probability 151). In the example provided, the probability is $\rho=3 \cdot 10^{-7}$ and the corresponding bounding squared singular value 153 is 304.70. To account for the noise power, the bounding squared singular value can be normalized using EQ. 10:

$$s_{min}=\sigma\sqrt{s_{min-standardized}^2/2}$$

$$s_{min-normalized}=10^{-5/2}\sqrt{304.70/2}=0.0390$$

To continue this non-limiting example, the singular value may be for a matrix A of observations. The matrix A may be used to generate a weights vector for an adaptive beamformer, as described above with regards to FIG. 1A. In this example, $$W(t) \approx \frac{l}{\delta}.$$

As given in EQ. 12, l=R\(R'\V) and the determination of l can be broken into the determination of y=R'\V through forward substitution and l=R\y through backward substitution. By EQ. 13:

$$\max(|y(:)|) \le \frac{\sqrt{n}}{s_{min}(A)}$$

$$\max(|y(:)|) \le 81.085$$

The minimum number of bits necessary to represent vector y using a fixed-point representation is therefore:

$$\text{ceil}(\log_2(\max(|y(:)|)))=7$$

By EQ. 14:

$$\max(|l(:)|) \le \frac{n}{s_{min\text{-}normalized}(A)^2}$$

$$\max(|l(:)|) \le 6574.63$$

The minimum number of bits necessary to represent vector l using a fixed-point representation is therefore:

$$\text{ceil}(\log_2(\max(|l(:)|)))=13$$

Similarly, the bound on β is:

$$\max(|\beta|) \le \frac{n}{s_{min\text{-}normalized}(A)^2}$$

$$\max(|\beta|) \le 6574.63$$

The minimum number of bits necessary to represent vector β using a fixed-point representation is therefore:

$$\text{ceil}(\log_2(\max(|\beta|)))=13$$

In this manner, a design environment can be configured to determine the minimum number of bits necessary for a fixed-point representation of the intermediate components of W(t) (e.g., y, l, and β). These values can be determined without requiring simulations (though a designer may perform simulations to validate a design). Furthermore, should the noise, the overflow probability, or the dimensions of A change, the number of bits can be re-determined without requiring additional simulations. Based on the minimum bit lengths, a designer can select hardware, such as processors, memory modules, or the like, for implementing an adaptive beamformer. For example, the minimum number of bits required to represent vector β is 13, so the designer may choose not to implement the device using a microprocessor only capable of supporting 8-bit fixed point operations.

Exemplary Method of Datatype Selection

FIG. 2 depicts a method 200 of selecting a datatype for use by a device consistent with disclosed embodiments. In some embodiments, method 200 can be performed by a design environment, as described herein. The design environment can be configured with a model representing a behavior of the device. The model can include an input and an output and can include an operation representable by a matrix. In some embodiments, the operation can be, or be equivalent to or be approximated by, solving EQ. 1 (e.g., Ax=b). In some embodiments, the inputs can be the A matrix and the b vector, and the output can be the x vector. In some embodiments, the design environment can be configured to use EQ. 7 or 8 to determine a smallest singular value for the matrix A. The smallest singular value can be used to determine datatypes for use by the system in solving EQ. 1. In this manner, the design environment can enable a designer to select datatypes for use in the system without requiring extensive simulation (e.g. to empirically determine or verify an overflow probability) or defaulting to more resource-intensive datatypes (e.g., floating-point representations instead of fixed-point representations, double precision instead of single precision, etc.). Accordingly, method 200 can benefit the designer by increasing the speed and flexibility of the design process, while reducing the likelihood of incorrect or unanticipated device operation through overflow errors.

Method 200 can be performed at least partially automatically by the design environment. For example, when a component is added to a model (e.g., a graphical, textual, hybrid graphical-textual model, or the like), the design environment can be configured to select, recommend, or validate one or more datatypes for this component. The selection, recommendation, or validation can be performed using parameters (e.g., datatypes, noise values, overflow probabilities, or the like) associated with at least one of the added component, existing components in the model, the overall model, the design environment, or resources (e.g., configuration files, m-files, scripts, or the like) associated with the design environment. In some embodiments, the selection, recommendation, or validation can be performed in response to an indication received from the user. In some instances, the user may instruct the design environment to determine one or more datatypes for the component. For example, the user may instruct the design environment using a menu, keyboard shortcut, cursor selection (e.g., mouse click) or the like. The disclosed embodiments are not limited to a particular way to instruct the design environment to determine the datatype for the component.

The design environment can be configured to determine multiple datatypes for the component. In some instances, the design environment may select or recommend different datatypes for different variables associated with the component. In various instances, the design environment can be configured to validate existing choices of datatypes (e.g., check that a choice of datatype is consistent with other selected parameters, such as the selected overflow probability). For example, the component can be an adaptive beamformer with a weights matrix $$W(t) \approx \frac{l}{\delta}.$$

The component can determine l using QR decomposition of a matrix A of observations through the two-step process of determining y=R'\V and then l=R\y. As described above, with regards to FIG. 1D, the design environment can select or recommend, based on the size of A, an overflow probability, and a noise value, a fixed-point datatype including at least 7 bits for the variable y and a fixed-point datatype including at least 13 bits for the variable l.

As described herein, the matrix used to determine the one or more datatypes can represent an operation performed by a model. The model can represent the behavior of a system. In some instances, the model can be configured to solve equation and the matrix can be the matrix A in EQ. 1. The overflow probability can be the probability that a smallest singular value (or smallest squared singular value) is less than a particular threshold value. The elements of A can be modeled as independent, identically distributed samples of noise. As described herein, the noise can be Gaussian noise or be a noise suitable for modeling as Gaussian noise, with or without transformation (e.g., one or a combination of at least two of thermal noise, quantization noise, pink noise, shot noise, burst noise, or some other noise present in an electrical, mechanical, or electromechanical device).

In step 201 of method 200, the design environment can obtain parameters including the dimensions of a matrix, an overflow probability, and a noise value. In some embodiments, at least one of the matrix dimensions, the overflow probability, or the noise value can be received by the design environment from a user. In some instances, the user may create or modify resources (e.g., a configuration file, m-file, script, or the like) specifying at least one of the dimensions, overflow probability, or noise value. In various instances, the user may interact with a graphical user interface of the design environment to provide the at least one of the dimensions, overflow probability, or noise value.

In some embodiments, the design environment can determine at least one of the dimensions, overflow probability, or noise value using one or more attributes of at least one of model component(s), the overall model, the design environment, or resource(s) (e.g., a configuration file, m-file, script, or the like) associated with the design environment. In some instances, the dimension of the matrix can be an attribute of a component of the model. For example, the model can include an adaptive beamformer component. The beamformer component can include one or more attributes indicating that training data is used to determine a weights vector for filtering the input data. The attributes can indicate that the training data includes 100 observations, each including 10 measurements. Based on these attributes, the design environment can determine that the size of matrix A is 100 rows and 10 columns.

In various instances, the noise value can be an attribute of the model, a component of the model, the design environment, or a resource. For example, an antenna component connected to the beamformer can include an attribute indicating that the output of the antenna includes thermal noise having a power of −50 dB. Based on this attribute, the design environment can determine that the variance of the noise is $\sigma^2=10^{-5}$. As another example, the model can be configured to assume thermal noise of −100 dB for all components. Alternatively, a default noise power may be assumed by the design environment or specified in a resource.

In some instances, the overflow probability can be an attribute of the model, a component of the model, the design environment, or a resource. For example, a beamformer component be associated with an overflow probability $\rho=0.001$. In such a situation, different components may have different associated overflow probabilities. As an additional example, the model can include an attribute specifying an overflow probability $\rho=0.0001$. As a further example, the design environment can specify a default overflow probability $\rho=0.01$. As another example, a user configuration file associated with the design environment can specify an overflow probability $\rho=0.0001$.

In step 203, the design environment can determine a singular value bound for the matrix using the matrix size, the overflow probability, and the noise value. As described herein, EQ. 7 and EQ. 8 relate the dimensions of matrix A, the overflow probability, and smallest squared singular value of matrix A. The design environment can be configured to use EQ. 7 (when A'A is real-valued) or EQ. 8 (when A'A is complex-valued) to determine a standardized smallest squared singular value having the specified overflow probability. The design environment can then use EQ. 9 (when A'A is real-valued) or EQ. 10 (when A'A is complex-valued) to scale the standardized singular value based on the noise value to yield a singular value bound for the matrix A. When the noise is not Gaussian, the design environment can be configured to transform the noise to approximate a Gaussian noise. When the noise value is not a variance, the design environment can be configured to transform the noise value into a variance or estimate a variance of the noise based on the noise value.

In step 205, the design environment can determine an output range for the model using an input range, or an input range for the model using the output range. The output range for the model can be the output range of the overall model, the output range of a component of the model, or the output range of an operation performed by the component of the model. Similarly, the input range can be the input range of the overall model, the input range of a component of the model or the input range of an operation performed by the component of the model. In some embodiments, the input range can be the range of the vector b in EQ. 1 and the output range can be the range of the vector x in EQ. 1.

In some embodiments, the output range (or input range) for the model can be received by the design environment from a user. In some instances, the user may create or modify resources (e.g., a configuration file, m-file, script, or the like) specifying the output range (or input range). In various instances, the user may interact with a graphical user interface of the design environment to provide the output range (or input range). In some embodiments, the design environment can determine the output range (or input range) using one or more attributes of at least one of model component(s), the overall model, the design environment, or resource(s) (e.g., a configuration file, m-file, script, or the like) associated with the design environment.

In some embodiments, the input and output ranges can be, or be determined from, attributes of a component. In some instances, a component may specify at least one of an input or output range. For example, a component representing a sensor can specify that the sensor output ranges between 0 and 500. In various instances, a component may specify a datatype (e.g., double) or a type of numeric representation and number of bits (e.g., fixed-point 16-bit output).

The design environment can determine a maximum input or output magnitude based on the specified range (e.g., when the output range is 0 to 500, the maximum output range can be 500), datatype (e.g., when the input range is a double, the maximum input magnitude can be $1.7*10^{308}$) or type of numeric representation and number of bits (e.g., when the output range is a fixed-point 16-bit output, the output range magnitude can be 65535).

Consistent with disclosed embodiments, the design environment can determine the output range for the model using EQ. 6, which relates the maximum magnitude of an output to the maximum magnitude of the input, the number of rows in matrix A, and the smallest singular value in matrix A (for a particular overflow probability, as determined in step 203). For example, when the maximum magnitude of the input is 1 (e.g., the input can range from −1 to 1) and the number of rows in A is 100, and the smallest singular value of A is 0.1, then the design environment can be configured to determine that the maximum magnitude of the output is 100 (e.g., the output can range from −100 to 100).

In some embodiments, the design environment can further scale the output range based on whether the A matrix is real- or complex-valued or based on the particular method used to solve EQ. 1. As a non-limiting example, when the solving EQ. 1 using QR decomposition using a CORDIC implementations of Givens rotations, the output range determined by EQ. 6 can be scaled by approximately 1.6468.

Consistent with disclosed embodiments, the design environment may alternatively determine the input range for the model using EQ. 6. For example, when the maximum magnitude of the output is 20 (e.g., the input can range from −20 to 20) and the number of rows in A is 60, and the smallest singular value of A is 0.1, then the design environment can be configured to determine that the maximum magnitude of the input is 0.26 (e.g., the input can range from −0.26 to 0.26). In some embodiments, the input range may be further modified based on the method used to solve EQ. 1 and whether the A matrix is real- or complex-valued. For example, when the solving EQ. 1 using QR decomposition using a CORDIC implementations of Givens rotations, the design environment can scale the input range determined by EQ. 6 by approximately 1/1.6468.

In step 207, the design environment can be configured to select or recommend one or more datatypes for use by the system. The selection or recommendation can be based on the determined input or output range. For example, the design environment can select a datatype for the output variable (e.g., vector x in EQ. 1) based on the determined output range. In some embodiments the output datatype can depend on a type of representation (e.g., fixed-point, or floating-point, rational or ratio data type, or the like). In some embodiments, the design environment can be configured to automatically select the type of representation (e.g., based on attributes of the component, the model, or the design environment). In various embodiments, the user can interact with the design environment to select the type of representation. The design environment can select a datatype for the output or input, given a type of representation, based on the range of the output or input. In some instances, when using a floating-point representation, the design environment may select one of float, double, long double floating-point datatypes, or the like. In various instances, when using a fixed-point representation, the design environment may select 4-bit, 8-bit, 16-bit, 32-bit, 64-bit, 128-bit fixed-point datatypes for the output or input. The design environment may select fixed-point bit-widths that are not powers of two, in some embodiments. In some instances, the design environment can be configured to use EQ. 11 to determine a number of bits to use for the output. For example, when the maximum magnitude of the input is 100; the output will be generated using the CORDIC algorithm; A is complex-valued, has 120 rows, and the minimum singular value for a given overflow probability is 0.5, then the number of bits necessary is:

$$\text{ceil}(\log_2(1.6468 \cdot \sqrt{2 \cdot 120} \cdot 100)) = 12$$

Accordingly, the design environment can determine that the output requires 12 bits. The design environment may then select or recommend a datatype for the output that is at least 12 bits wide (e.g., an int datatype).

In step 209, in some embodiments, the system can be configured to use a selected datatype. The datatype may have been selected by the design environment or recommended by the design environment and approved by a user. In some embodiments, the design environment can configure the system to use the selected datatype. For example, the design environment may convert the model into code. The code may use the selected datatype. To continue the previous example, when the design environment determines that the output requires 12 bits and selects int as the datatype for the output, the design environment can be configured to generate code in which the datatype of the output is int. The code can be loaded onto the system directly by the design environment or indirectly (e.g., the code can be provided to a computing device that loads the code onto the system). In various embodiments, a designer can implement the system using the selected or recommended datatype. For example, the designer can choose components for the system based on the selected or recommended datatype. To continue the prior example, the designer can select a component, such as a microprocessor, capable of supporting 12-bit fixed-point operations, based on the determination that the output requires 12 bits.

In step 211, in some embodiments, the design environment can be configured to provide an indication of the selected or recommended one or more datatypes. In some embodiments, the design environment can display the indication on a graphical user interface. In various embodiments, the design environment can store the indication in a file (e.g., a log file, a configuration file, a design history document, a reliability certification, or the like). The indication can describe at least one of the model, component, or variable associated with the component for which a datatype has been selected. In some embodiments, the indication can further describe the basis for the choice (e.g., when the datatype is selected or recommended for an output, at least one of the maximum magnitude of the input, the dimensions of matrix A, the bound on the smallest singular value for A, the noise value, the overflow probability, or the like). In this manner, the design environment can provide information suitable for informing the design process (e.g., by indicating the factors influencing the selection or recommendation of the datatype) or documenting the reliability of the system.

Exemplary Method of Selecting a Minimum Noise Value

Figure 3:
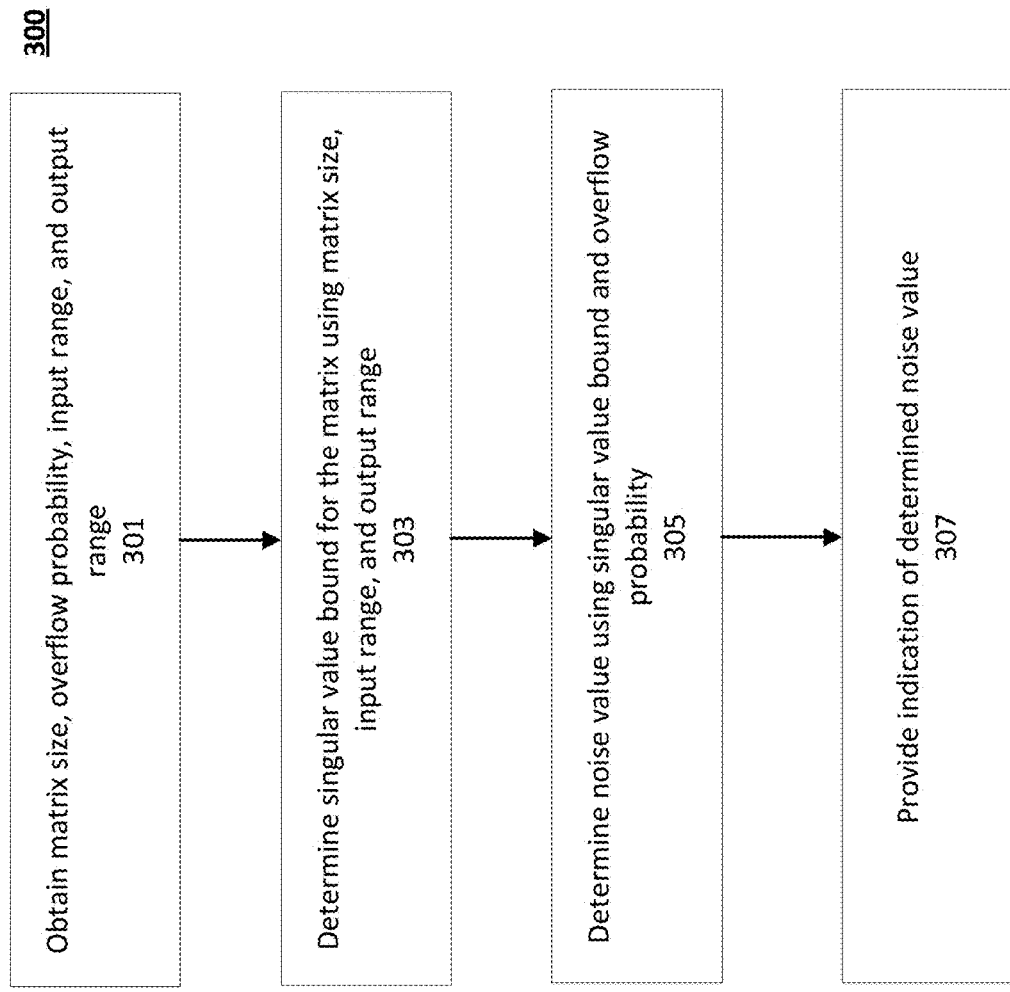
FIG. 3 depicts an exemplary method of selecting a minimum noise value for a device, consistent with disclosed embodiments.

FIG. 3 depicts a method of selecting a minimum noise value for a device, consistent with disclosed embodiments. In some embodiments, method 300 can be performed by a design environment, as described herein. As described above with regards to FIG. 2, the design environment can be configured with a model representing a behavior of the device. The model can include an input and an output and can include an operation representable by a matrix. In some embodiments, the operation can be, be equivalent to, or be approximated by, solving EQ. 1 (e.g., Ax=b). In some embodiments, the inputs can be the A matrix and the b vector, and the output can be the x vector. In some embodiments, the design environment can be configured to use EQ. 6 and EQ. 7 or 8 to determine a smallest singular value for the matrix A and a standardized eigenvalue A of the matrix A'A. The smallest singular value and standardized eigenvalue can be used to determine or recommend a noise value for the system in solving EQ. 1. Should a corresponding value of the system noise be less than this noise value, the probability of an overflow error may exceed the specified overflow probability.

Consistent with disclosed embodiments, determining or recommending the noise value can aid the design process by imposing a minimum noise constraint. Other design choices, such as the selection of low-noise components in the system, may be preempted by the imposition of this minimum noise constraint. Alternatively, when the noise value is unacceptably high, a designer may choose to revise other parameters of the design, such as the dimensions of the A matrix, to reduce the minimum noise value. Furthermore, determining the noise value may enable a designer to select hardware for implementing the system more quickly or accurately, based on the noise values associated with differing hardware selections. For example, a designer may disregard components with minimum noise values less than the minimum noise value determined for the model. In this manner, the design environment can use method 300 to improve the design process, benefiting the designer.

Similar to method 200, method 300 can be performed at least partially automatically by the design environment. The design environment can be configured to determine a noise value when a component is added to a model, or in response to an instruction received from the user. The disclosed embodiments are not limited to a particular way to instruct the design environment to determine the noise value.

Similar to the matrix in method 200, the matrix in method 300 can represent an operation performed by a model. The model can represent the behavior of a system. In some instances, the model can be configured to solve equation and the matrix can be the matrix A in EQ. 1. The elements of A can be modeled as independent, identically distributed samples of the noise. The overflow probability can be the probability that a smallest singular value (or smallest squared singular value) is less than a particular value. The maximum magnitude of the input can be the maximum magnitude of the vector b in EQ. 1, while the maximum magnitude of the output can be maximum magnitude of the vector x in EQ. 1.

In step 301 of method 300, the design environment can be configured to obtain parameters including the dimensions of a matrix, an overflow probability and the maximum input and output ranges. In some embodiments, at least one of the matrix dimensions, the overflow probability, or the maximum input and output magnitudes can be received by the design environment from a user. In some instances, the user may create or modify resources specifying at least one of the dimensions, overflow probability, or maximum input and output ranges. In various instances, the user may interact with a graphical user interface of the design environment to provide at least one of the matrix dimensions, overflow probability, or maximum input and output magnitudes.

In some embodiments, the design environment can determine at least one of the dimensions, overflow probability, or input and output range using one or more attributes of at least one of model component(s), the overall model, the design environment, or resource(s) (e.g., a configuration file, m-file, script, or the like) associated with the design environment. As described with regards to FIG. 2, the dimension of the matrix may be an attribute of a component of the model. The overflow probability can be an attribute of the model, the design environment, or a resource. The input and output ranges can be, or be determined from, attributes of a component. The design environment can determine a maximum input and output magnitude based on the input and output ranges.

In step 303, the design environment can be configured to determine a singular value bound for the matrix using the matrix size and the overflow probability. As described herein, EQ. 6 relates the number of rows in matrix A, the maximum magnitudes of the input and output, and the smallest singular value of matrix A. The design environment can be configured to use EQ. 6 to determine a smallest singular value of A.

In step 305, the design environment can be configured to determine a noise value using the smallest squared singular value, matrix size, and overflow probability. The design environment can be configured to determine the standardized eigenvalue A of A'A using either EQ. 8 or EQ. 9 (depending on whether A is real- or complex-valued), which depend on the dimensions of A and the overflow probability.

The design environment can then solve EQ. 9 or 10 (depending on whether A is real- or complex-valued) to determine a noise variance. The noise variance can be a minimum noise variance. When the system noise is approximately Gaussian, or modeled as Gaussian noise, the noise variance can be the noise value for the system noise. In some instances, the design environment can transform a Gaussian noise having the determined variance into another noise distribution to obtain the noise value (e.g., when the relevant noise is not approximately Gaussian, or not modeled as a Gaussian noise). For example, when the relevant noise is right-skewed, the design environment can accomplish this transformation using an inverse log-transform.

In step 307, the design environment can be configured to provide an indication of the determined minimum noise value for the device. In some embodiments, the design environment can display the indication on a graphical user interface. In various embodiments, the design environment can store the indication in a file (e.g., a log file, a configuration file, a design history document, a reliability certification, or the like). The indication can describe at least one of the model or component for which the noise value has been determined. In some embodiments, the indication can further describe the basis for the choice (e.g., the input and output ranges, representations, or datatypes; the dimensions of matrix A, the bound on the smallest singular value for A, the overflow probability, or the like). In this manner, the design environment can provide information suitable for informing the design process (e.g., by indicating the factors influencing the noise value) or documenting the reliability of the system.

Exemplary Method of Matrix Size Selection

Figure 4:
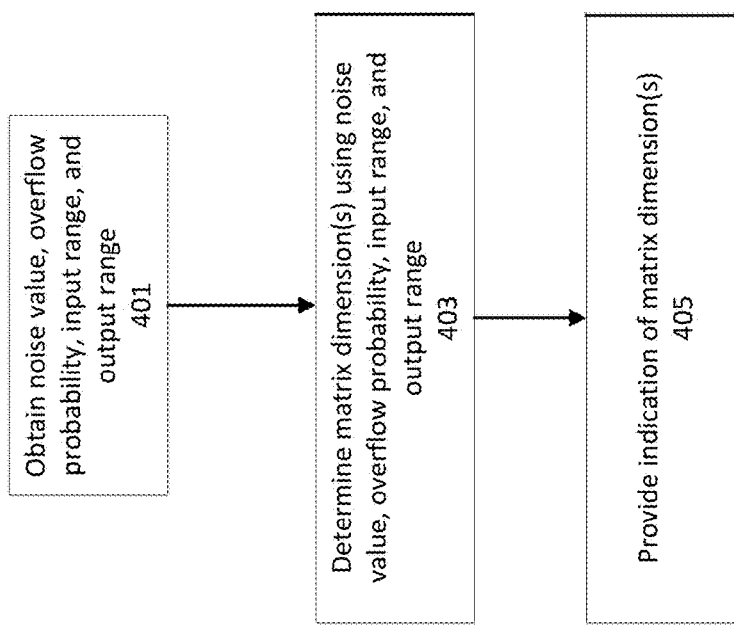
FIG. 4 depicts an exemplary method of selecting a matrix size for a device, consistent with disclosed embodiments.

FIG. 4 depicts a method 400 of selecting a matrix size for a system, consistent with disclosed embodiments. In some embodiments, method 400 can be performed by a design environment, as described herein. As described above with regards to FIG. 2, the design environment can be configured with a model representing a behavior of the system. The model can include an input and an output and can include an operation representable by a matrix. In some embodiments, the operation can be, be equivalent to, or be approximated by, solving EQ. 1 (e.g., Ax=b). In some embodiments, the inputs can be the A matrix and the b vector, and the output can be the x vector.

In some embodiments, the design environment can determine a relationship between a gain of the system, the noise, the overflow probability, and the dimensions of A. The gain of the system can be the gain from input to output. According to EQ. 6, the gain can depend on a number of rows in A and the smallest singular value of A. According to EQS. 7 and 9 or 8 and 10, the smallest singular value of A, in turn, can depend on the noise value, the overflow probability, and the dimensions of A. Thus, the dimensions of A can be related to the noise value, overflow probability, and gain (e.g., the input and output ranges). In this manner, the design environment can enable the designer to determine the dimensions of A, given the noise value, overflow probability, and desired gain between the input and output ranges (or the datatypes for the inputs, outputs, and any intermediate variables used to solve EQ. 1). In this manner, the design environment can provide the designer rapid feedback on the effect of design choices on the configuration of the system. For example, when the system is a beamformer, the dimensions of matrix A can represent the number of signal receivers (e.g., antennas, antenna elements, or the like) and the number of observations used to generate the weights matrix. The design environment can provide feedback on how such fundamental characteristics of the beamformer are affected by design choices like the minimum system noise value and the output datatype. The design environment can provide this feedback without performing extensive simulation (or in some instances any simulation), benefiting the designer by speeding, and improving the flexibility of, the design process.

Similar to method 200, method 400 can be performed at least partially automatically by the design environment. The design environment can be configured to determine the dimensions of matrix A or the forgetting factor when a component is added to a model, or in response to an instruction received from the user. The disclosed embodiments are not limited to a particular way to instruct the design environment to determine the dimensions of matrix A or the forgetting factor.

Similar to the matrix in method 200, the matrix in method 400 can represent an operation performed by a model. The model can represent the behavior of a system. In some instances, the model can be configured to solve EQ. 1 and the matrix can be the A matrix in EQ. 1. The elements of A can be modeled as independent, identically distributed samples of the noise. The overflow probability can be the probability that a smallest singular value (or smallest squared singular value) is less than a particular threshold value. The maximum magnitude of the input can be the maximum magnitude of the vector b in EQ. 1, while the maximum magnitude of the output can be maximum magnitude of the vector x in EQ. 1.

In step 401 of method 400, the design environment can be configured to obtain parameters including an overflow probability, a noise value, and the maximum input and output ranges. As described herein, in some instances the maximum input and output ranges can be determined from experimental data, device or component specifications, or the datatypes of the variables in EQ. 1. In some embodiments, at least one of the overflow probability, noise value, or maximum input and output magnitudes can be received by the design environment from a user. In some instances, the user may create or modify resources (e.g., a configuration file, m-file, script, or the like) specifying at least one of the overflow probability, noise value, and maximum input and output ranges. In various instances, the user may interact with a graphical user interface of the design environment to provide at least one of the overflow probability, noise value, or maximum input and output magnitudes.

In some embodiments, the design environment can determine at least one of the overflow probability, noise value, or maximum input and output magnitudes using one or more attributes of at least one of model component(s), the overall model, the design environment, or resource(s) (e.g., a configuration file, m-file, script, or the like) associated with the design environment. As described with regards to FIG. 2, each of the noise value and the overflow probability can be an attribute of the model, the design environment, or one or more resources. As described with regards to FIG. 3, the input and output ranges can be, or be determined from, attributes of a component. The design environment can determine a maximum input and output magnitude based on the input and output ranges.

In step 403, the design environment can be configured to determine the matrix dimensions using the noise value, overflow probability, input range, and output range. In some embodiments, a solver can select matrix dimensions potentially satisfying EQS. 6, 7, and 9 (when A is real-valued); or 6, 8, and 10 (when A is complex valued). The solver can determine whether the assumed matrix dimensions are consistent with the remaining parameters. For example, given the assumed matrix dimensions and the noise value, overflow probability, and input range, the solver can determine whether a calculated maximum output magnitude exceeds the specified maximum output magnitude. If the maximum output magnitude does not exceed the specified maximum output magnitude, then the solver can repeat the determination using an A matrix with fewer rows (or more columns). If the maximum output magnitude exceeds the specified maximum output magnitude, then the solver can repeat the determination using an A matrix with more rows (or fewer columns). The disclosed embodiments are not limited to using the maximum output magnitude to determine consistency. Consistency can be checked against other parameters, such as the input range, the noise value, or the overflow probability.

In some embodiments, the solver may only test a particular combination of number of rows and number of columns once. In some embodiments, the design environment may obtain the number of columns and determine the minimum number of rows consistent with the remaining parameters. In various embodiments, the design environment may obtain the number of rows and determine the maximum number of columns consistent with the remaining parameters.

In step 405, the design environment can be configured to provide an indication of matrix dimensions consistent with the remaining parameters. In some embodiments, the design environment can display the indication on a graphical user interface. In various embodiments, the design environment can store the indication in a file (e.g., a log file, a configuration file, a design history document, a reliability certification, or the like). The indication can describe at least one of the model or component for which the matrix dimensions have been determined. In some embodiments, the indication can further describe the basis for the choice (e.g., the input and output ranges, representations, or datatypes; the noise value, the bound on the smallest singular value for A, the overflow probability, or the like). In this manner, the design environment can provide information suitable for informing the design process (e.g., by indicating the factors influencing the valid choices of matrix dimension) or documenting the reliability of the system.

In some embodiments, the indication may be at least partially graphical. For example, the design environment can display a plot, with the x axis representing the number of columns (or rows) and the y axis representing the number of rows (or columns). For each dimension value tested (e.g., each combination of row number and column number tested), an indication of the outcome of the test can be displayed at the corresponding x-y position on the plot. Depending on the choice of parameters, the plot may indicate a region showing dimension values consistent with the other parameters and/or a region showing dimension values inconsistent with the other parameters.

In some embodiments, the indication may be at least partially textual. For example, the design environment can display one or more acceptable dimension values for matrix A (e.g., the dimension values including the smallest number m of rows, the smallest number n of columns, the smallest value of a metric dependent on the number of rows and columns, or according to some similar selection criterion). The acceptable dimension values can be listed in the graphical user interface of the design environment.

Exemplary Method of Device Configuration

Figure 5:
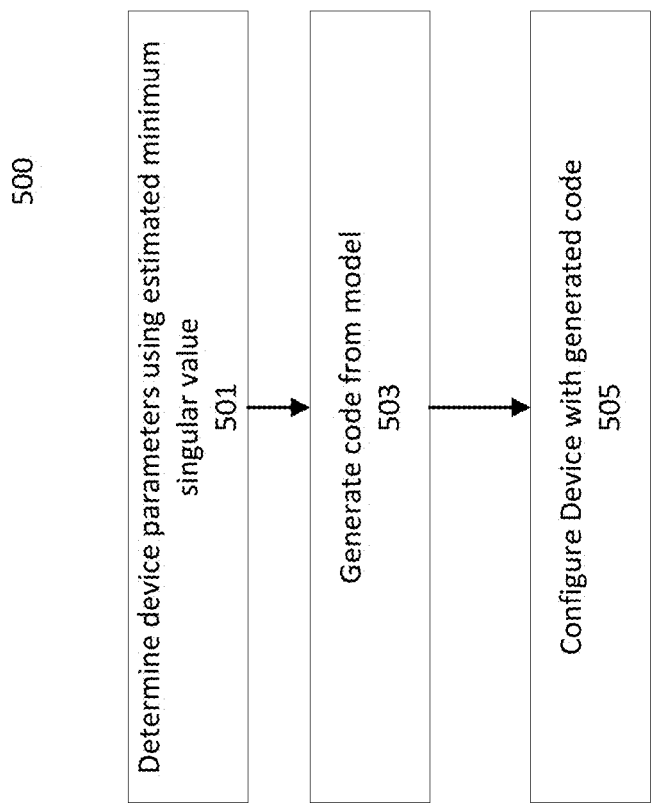
FIG. 5 depicts an exemplary method of configuring a device using selected design parameters, consistent with disclosed embodiments.

FIG. 5 depicts a method 500 of configuring a device using selected design parameters, consistent with disclosed embodiments. Method 500 can include designing a model of a system, generating code from the model, and configuring the system using the generated code. Model design can include the automatic selection or recommendation of one or more design parameters related to solving a system of linear equations. As described herein, the selected or recommended design parameters can include the maximum input magnitude, max(|x(:)|) (e.g., the maximum magnitude of the unscaled weights vector/used by an adaptive beamformer to weight an observation vector, as described above with respect to FIG. 1A), the maximum output magnitude, max (|b(:)|) (e.g., the maximum magnitude of the steering vector V, as described above with respect to FIG. 1A), the dimensions of matrix A (e.g., the matrix of observations described above with respect to FIG. 1A), the smallest singular value of matrix A, a noise value concerning the elements of the matrix A, and an overflow probability. The selected or recommended design parameters can further include a datatype of the output, of the input, or of one or more intermediate variables used to generate the output. As described herein, the selection or recommendation may be performed without requiring extensive simulation, reducing the time and resources required to design a device, improving the flexibility of the design process, and enabling the designer to better balance device characteristics (e.g., performance, cost, size, component availability, etc.). Accordingly, configuring a design environment to perform method 500 can improve the functionality and usability of the design environment.

In step 501, a design environment can determine design parameters using an estimated minimum singular value. The design parameters can relate to a model or model component being designed using the design environment. The model or model component can be a graphical model, textural model, or hybrid model including graphical and textural components. The model can be executable in a design environment to simulate the behavior of the real-world system, e.g., a device, that the model represents. In some instances, the user can determine an input or output range or input or output datatype, as described above with regards to FIG. 2. In various instances, the user can determine a minimum noise value, as described above with regards to FIG. 3. In some instances, the user can determine dimensions for the matrix A in EQ. 1, as described above with regards to FIG. 4. More generally, the user can interact with the design environment to determine or validate value(s) for one of the parameters described above with regards to EQS. 7 to 10 (e.g., max(|x (:)|), max(|b(:)|), m, n, $\lambda$, $\sigma^{-2}$, $\alpha$, $\gamma$, and $\rho$, or the like) using the remaining parameters. The determination can include estimating a minimum singular value subject to an overflow probability, or determining that the overflow probability corresponding to a minimum singular value satisfies a design criterion (e.g., is less than a threshold overflow probability). The user can also determine or validate design choices in the model based on one or more of these parameters (e.g., the choice of a datatype, number of antennas, or the like).

In step 503, code can be generated from the model. The code can be generated by the design environment or a stand-alone code generation tool (e.g., a code generator such as MATLAB® Coder™, Simulink® Coder™, HDL Coder™, Filter Design HDL Coder™, Vision HDL Toolbox™, Wireless HDL Toolbox™, GPU Coder™, Embedded Coder®, Simulink® PLC Coder™, TargetLink™, ECCO™, ASCET, SCADE Suite KCG, QGen, or the like. The code generator can be configured to convert or translate a graphical, textual, or hybrid model into instructions in Ada, Basic, C, C++, C#, FORTRAN, machine code, assembly code, GPU code e.g., CUDA, HDL, VHDL, Verilog, SystemC, or netlists, which can be compiled (if necessary) and executed on the device. The code generator can be configured to generate code in one or more languages and for configuring one or more types of devices. The code generator can be configured to accept an indication of a target language or target device type. The code generator can be configured to automatically handle conversion between different datatypes, such as fixed and floating-point datatypes. The code generated by the code generator may have datatypes specified in the model. These datatypes can be the datatypes selected or recommended by the design environment.

As example of generating code having datatypes selected or recommended by the design environment, the design environment can determine, based on the input range, overflow probability, matrix size, and noise value, as described above with regards to FIG. 2, that the range of a variable storing the solution to EQ. 1 (e.g., the output range) can be represented by an 8-bit fixed-point number. In response to this determination, the model may be automatically, semi-automatically, or manually configured to specify that the variable storing the solution to EQ. 1 be represented by an 8-bit fixed-point number (or, in some instances, a representation with at least the range and precision of an 8-bit fixed-point number, such as a 10-bit fixed point number or a double). The code generator can be configured to generate code that implements that variable uses an 8-bit fixed-point number.

The automatically generated code may implement other selections or recommendations for other design parameters (e.g., the dimensions of the A matrix). In some instances, the selected or recommended matrix dimensions may be implemented by the code. For example, when the model includes a system of equations that can be represented by a matrix, and the design environment determines, based on a noise value, overflow probability, input range, and output range as described above with regards to FIG. 4, that a dimension of 10 rows and 5 columns for the matrix is consistent with an specified overflow probability of 0.00001, then a variable representing the matrix in the code can have 10 rows and 5 columns.

In step 505, the device can be configured using the generated code. Once configured, the device may perform as simulated by the model. In some instances, such configuration can include deploying the code to the device. In various instances, such configuration can include deploying information derived from the code (e.g., an implementation of the code in machine code, assembly, a netlist specifying a connection of gates in the device, or the like). In various embodiments, the device can be configured using a known toolchain (e.g., such as the GNU Arm Embedded toolchain, Tensilica Software Development Kit, Xilinx SDK, or the like). The disclosed embodiments are not limited to any particular method of configuring the device using the generated code. For example, the model can represent an automatic beamformer. Code can be generated from the model and deployed to a hardware device (e.g., a CPU, GPU, APU, DSP, FPGA, ASIC, or the like). In operation, the hardware device can execute the code to perform the automatic beamforming functionalities specified by the model.

Exemplary User Interface

Figure 6:
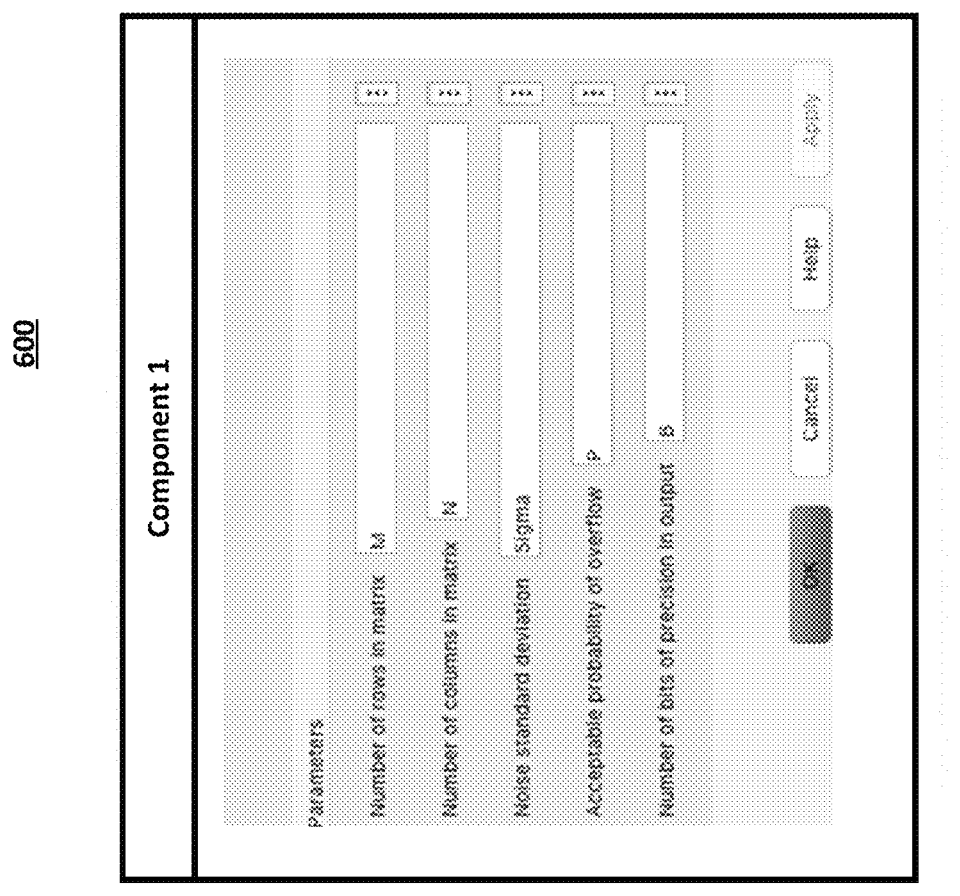

FIG. 6 depicts an exemplary user interface 600 usable to provide design parameters to the methods and systems described in this disclosure. As shown, the design parameters can correspond to the dimension of matrix A from EQ. 1, a noise value (e.g., a standard deviation in this non-limiting example), an overflow probability, and a number of bits precision in the output (e.g., the number of bits to the right of the binary point). As described herein, these values can be used to determine a datatype of the output, given the input range. Likewise, given the number of bits precision in the input and the remaining values depicted in FIG. 6, a datatype of the input can be determined, given the output range. The user interface 600 can correspond to a component in a model (e.g., "component 1" as shown), or to an overall model, or to a design environment (e.g., such a user interface can be used to set default noise or overflow probability parameters for the user environment). In some instances, the user may access the exemplary user interface by selecting component 1 in a design canvas of the design environment. For example, a user might select beamformer 101 in FIG. 1A to access a user interface for setting parameters of beamformer 101. The disclosed embodiments are not limited to such a method of accessing this exemplary user interface.

Exemplary Modeling Environment

Figure 7:
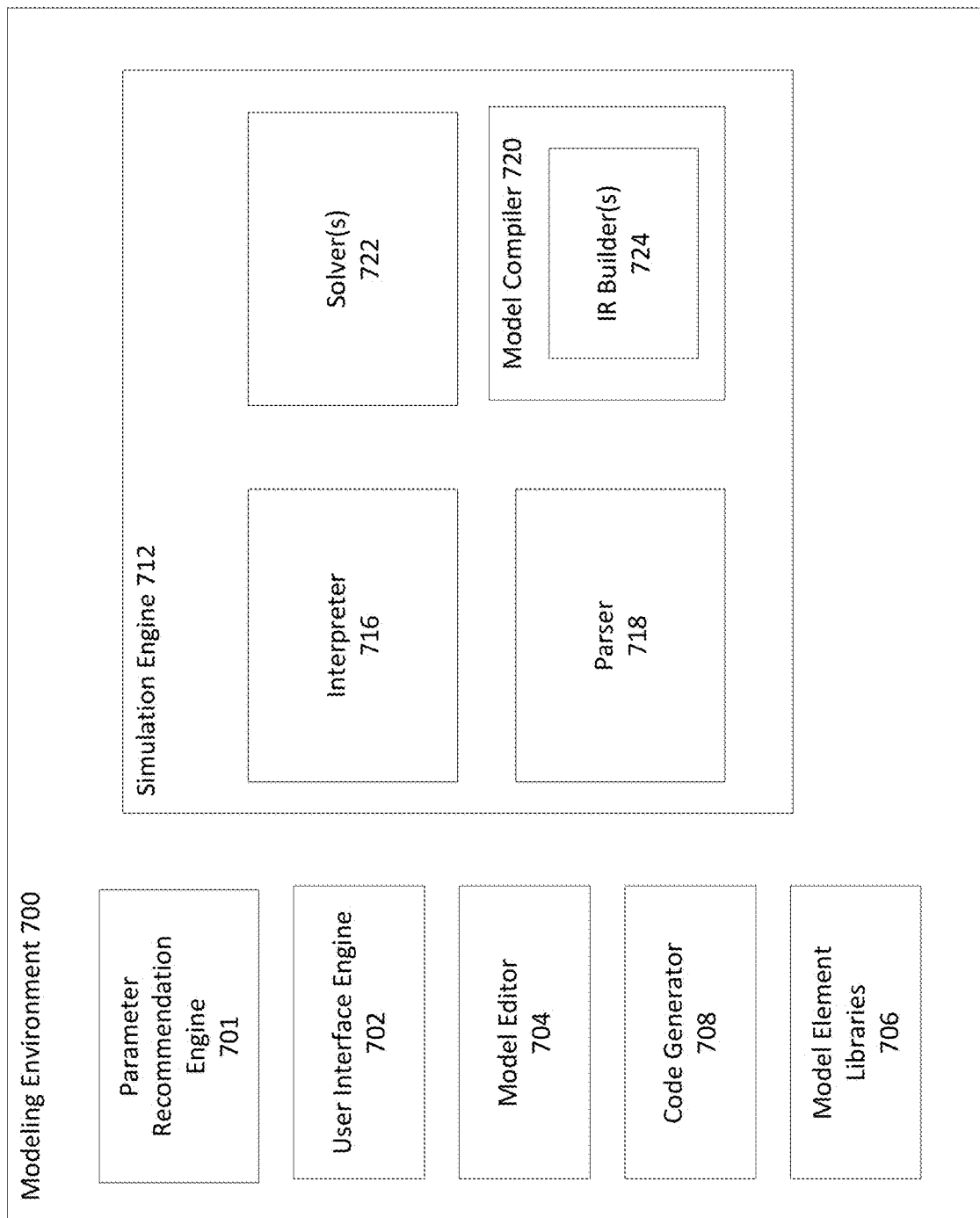
FIG. 7 depicts an exemplary modeling environment useable to select, recommend, and validate design parameters for a model, consistent with the disclosed embodiments.

FIG. 7 depicts an exemplary modeling environment useable to select, recommend, or validate parameters of a model, consistent with disclosed embodiments. In some instances, such a modeling environment can be, be included in, include, or implement functionalities of a design environment as described herein. The modeling environment 700 can include a parameter recommendation engine 701, a User Interface (UI) engine 702, a model editor 704, one or more model element libraries 706, a code generator 708, and a simulation engine 712.

The parameter recommendation engine 701, for a component or model representing an operation of a device that can be expressed in the form of EQ. 1, a parameter of the device (e.g., the dimensions of matrix A, the input or output range, the overflow probability, the noise value, or the like) based on the remaining parameters. In some instances, the parameter recommendation engine 701 can perform at least the example methods or part of the example methods described in FIGS. 1A-1D, and 2-6. For example, the engine 701 can determine an input or output range, as described above with regards to FIG. 2. In some instances, the parameter recommendation engine 701 can determine a minimum noise value, as described above with regards to FIG. 3. In some instances, the parameter recommendation engine 701 can determine acceptable matrix dimensions, as described above with regards to FIG. 4. The parameter recommendation engine 701 is not limited to these determinations. Rather, the parameter recommendation engine 701 can use the relationships between the parameters described herein to determine values or ranges of values of one or more of the parameters in terms of ranges or values of ranges of one or more other ones of the parameters. Although shown as part of the modeling environment 700, the engine 701 can be an independent tool that can allow a user to work on models constructed in a modeling environment like the environment 700. The engine 701 may also be implemented by adding functionalities to existing components such as simulation engine 712 or user interface engine 702.

The UI engine 702 can create and present one or more User Interfaces (UIs), such as Graphical User Interfaces (GUIs) and/or Command Line Interfaces (CLIs), on a display of a data processing device, such as a workstation, laptop, tablet, etc. The GUIs and CLIs can provide a user interface to the modeling environment 700, such as a model editing window. The model editor 704 can perform selected operations on a model, such as open, create, edit, and save, in response to the user inputs or programmatically. In some embodiments, the UIs can include UIs for providing parameter value to the modeling environment, such as user interface 600 described above with regards to FIG. 6.

The simulation engine 712 can include an interpreter 716, a parser 718, a model compiler 720, and one or more solvers (e.g., solver(s) 722). The model compiler 720 can include one or more Intermediate Representation (IR) builders (e.g., IR builder(s) 724). In some implementations, the one or more IR builders can be included or associated with the solvers 722. The simulation engine 712 can execute, e.g., compile and run or interpret, computer-generated, executable models using solver(s) 722. For example, solver(s) 722 can generate a set of equations for a model and can solve the set of equations. Solver(s) 722 can also generate a solution for an in-memory, intermediate representation (IR) of a model that represents a set of equations. Solver(s) 722 can generate the solution for the IR using numerical techniques. Exemplary solvers include one or more fixed-step continuous time solvers, which can utilize numerical integration techniques, and one or more variable-step solvers, which may, for example, be based on the Runge-Kutta or Dormand-Prince pair. With a fixed-step solver, the step size remains constant throughout simulation of the model. With a variable-step solver, the step size can vary from step to step, for example to meet error tolerances. A non-exhaustive description of suitable solvers may be found in the Simulink User's Guide from The MathWorks, Inc. (March 2017 ed.)

Code generator 708 can access a model and can generate code for the model, for example as described above with regards to FIG. 5. In some embodiments, the generated code can be source code, which can be compiled by the model compiler 720, and executed by one or more processors outside of the modeling environment 700. The generated code can thus be standalone code relative to the modeling environment 700. Examples of generated code include Ada, Basic, C, C++, C#, FORTRAN, machine code, assembly code, GPU code, and HDL code, such as VHDL, Verilog, SystemC, or netlists, among others, which may be used to synthesize a programmable logic device.

Exemplary modeling environments include the MATLAB® technical computing environment (TCE) and the Simulink® model-based design environment both from The MathWorks, Inc. of Natick, Mass., as well as the Simscape™ physical modeling system, the SimEvents® discrete-event modeling tool, and the Stateflow® state chart tool also from The MathWorks, Inc., the MapleSim physical modeling and simulation tool from Waterloo Maple Inc. of Waterloo, Ontario, Canada, the GTSUITE modeling and simulation environment from Gamma Technologies, LLC of Chicago, Ill., the Ricardo WAVE and WAVE RT modeling and simulation tools of Ricardo Software of Chicago, Ill., a subsidiary of Ricardo plc, the AVL Boost modeling and simulation tool of AVL Gmbh of Graz, Austria, the LabVIEW virtual instrument programming system and the NI MatrixX model-based design product both from National Instruments Corp. of Austin, Tex., the Visual Engineering Environment (VEE) product from Keysight Technologies Inc. of Santa Rosa, Calif., the System Studio model-based signal processing algorithm design and analysis tool and the SPW signal processing algorithm tool from Synopsys, Inc. of Mountain View, Calif., a Unified Modeling Language (UML) system, a Systems Modeling Language (SysML) system, the System Generator system from Xilinx, Inc. of San Jose, Calif., and the Rational Rhapsody Design Manager software from IBM Corp. of Somers, N.Y. Models created in the high-level modeling environment can contain less implementation detail, and thus operate at a higher level than certain programming languages, such as the C, C++, C#, and SystemC programming languages.

With a modeling environment 700, simulated execution of a model can be carried out, e.g., to approximate the operation of a dynamic system. Simulated execution of a model may also be referred to as simulating the model. Models constructed within the modeling environment 700 may include textual models, graphical models, such as block diagrams, state-based models, discrete-event models, physical models, and combinations thereof. A graphical model can include icons or blocks that represent computations, functions or operations, and interconnecting lines or arrows among the blocks can represent data, signals, or relationships among those computations, functions, or operations. The icons or blocks, moreover, can be selected by the user from one or more of the libraries or palettes 706 that contain icons or blocks for the blocks supported by the modeling environment 700. A model editor GUI can include a Run button that can be selected by the user. The modeling environment 700 can also be configured to receive a run command entered by the user, e.g., in the GUI or in a Command Line Interface (CLI). In response to the user selecting the Run button or entering the run command, the simulation engine 712 can execute the model, and can present the results of the model's execution to a user. Exemplary graphical models include Simulink models, Simscape physical models, SimEvents models, Stateflow charts, LabVIEW block diagrams, MatrixX models, Scade models, and VEE diagrams, among others. Other forms of the source program include Modelica models from the Modelica Association, Uniform Modeling Language (UML) models, and Systems Modeling Language (SysML) models, among others.

The MATLAB® TCE is a math-oriented, textual programming environment for digital signal processing (DSP) design, among other uses. The Simulink® model-based design environment is a modeling tool for modeling and simulating dynamic and other systems, among other uses. The MATLAB® and Simulink® environments provide a number of high-level features that facilitate algorithm development and exploration, and support model-based design. Exemplary high-level features include dynamic typing, array-based operations, data type inferencing, sample time inferencing, and execution order inferencing, among others.

In some embodiments, the modeling environment 700 may implement a declarative language. A declarative language is a language that expresses the logic of a computation without describing its control flow. A declarative language can describe what a program must accomplish in terms of the problem domain, rather than describe how to accomplish it as a sequence of the programming language primitives. In some cases, a declarative language can implement single assignment in which variables are assigned once and only once. Examples of declarative languages include the Simulink® model-based design environment, which is a time-based language, the Modelica modeling language, and the LabVIEW graphical programming system, HDL, the Prolog language, and the Haskell language, among others. Behaviors of at least some of the model elements and connection elements of a model can include computational implementations that are implicitly defined by a declarative language. The modeling environment may also implement or integrate imperative language (like C, C++, MATLAB, etc.) or a combination of declarative and imperative languages.

It should be understood that the modeling environment 700 is intended for illustrative purposes and that the present disclosure can be used with other modeling environments.

For example, in some implementations, the code generator 708 and/or the compiler 720 can be separate from the modeling environment 700.

One or more of the user interface engine 702, the model editor 704, the code generator 708, the model compiler 720, and the simulation engine 712 can be implemented through one or more software modules and/or libraries containing program instructions that perform the methods described herein when executed on logic circuitry of one or more processors. The software modules can be stored in a memory, such as a main memory, a persistent memory, or a computer readable media, of a workstation, server, or other data processing machine or device, and executed by one or more processors. Other computer readable media can also be used to store and execute these program instructions, such as non-transitory computer readable media, including optical, magnetic, or magneto-optical media. In some embodiments, one or more of the user interface engine 702, the model editor 704, the code generator 708, the model compiler 720, and the simulation engine 712 can comprise hardware registers and combinational logic configured and arranged to produce sequential logic circuits. In some embodiments, various combinations of software and hardware, including firmware, can be utilized to implement the described methods.

Suitable code generators for use with the present disclosure include, but are not limited to, the Simulink Coder, the Embedded Coder, the MATLAB® Coder™, and the Simulink HDL Coder products from The MathWorks, Inc. of Natick, Mass., and the TargetLink product from dSpace GmbH of Paderborn Germany. Suitable target language compilers include the Simulink Real Time™ tool from The MathWorks, Inc., and a C language compiler. However, other code generation systems and other compilers can be used in addition to or alternative to those described for the modeling environment 700.

Exemplary Computing Environment

Figure 8:
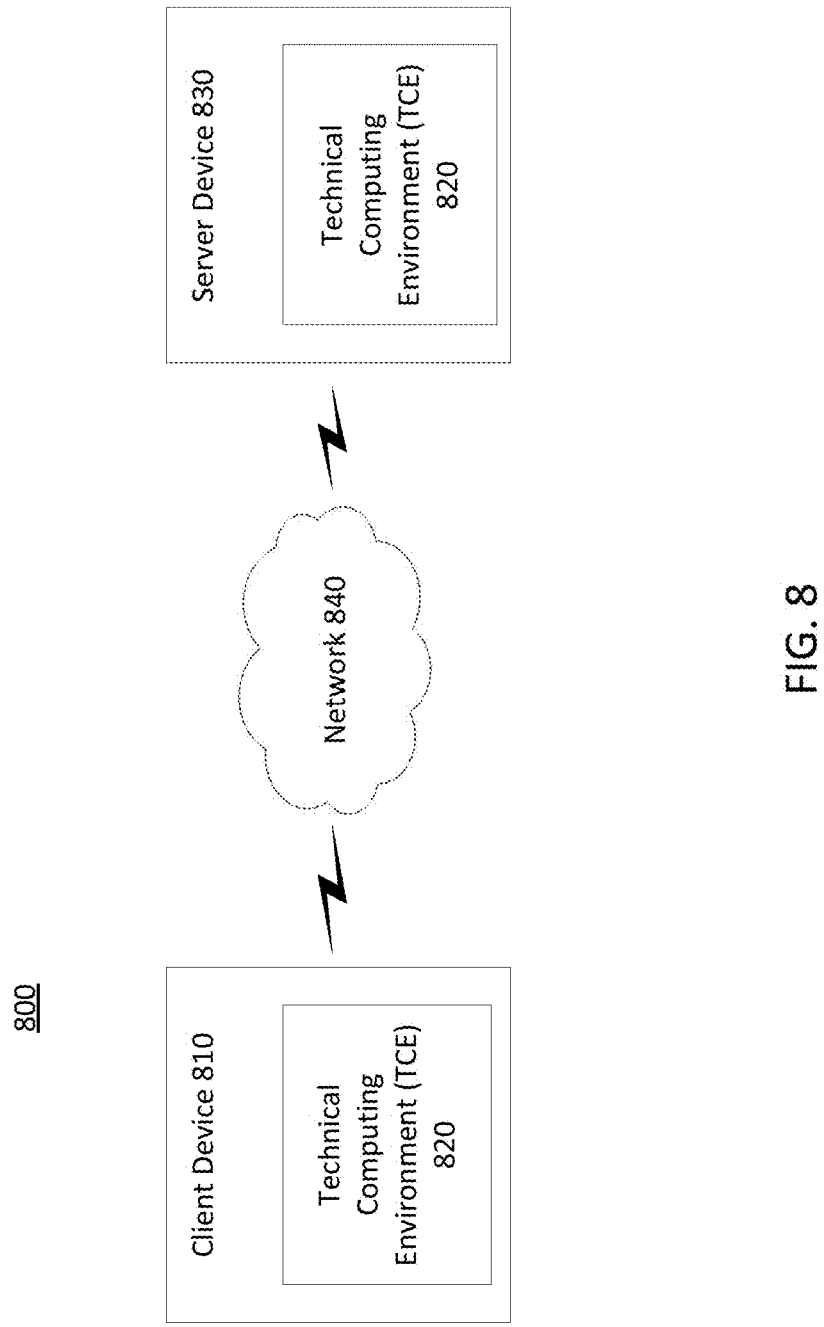
FIG. 8 depicts an exemplary computing environment in which systems and/or methods, described herein, may be implemented, consistent with disclosed embodiments.

FIG. 8 depicts an exemplary computing environment 800 in which systems and/or methods, described herein, may be implemented, consistent with disclosed embodiments. In some instances, such a computing environment can be, be included in, include, or implement functionalities of a design environment as described herein. As shown in FIG. 8, environment 800 may include a client device 810, which may include a programming environment (e.g., TCE 820). Furthermore, environment 800 may include a server device 830, which may include the programming environment (e.g., TCE 820), and a network 840. Devices of environment 800 may interconnect via wired connections, wireless connections, or a combination of wired and wireless connections.

Client device 810 may include one or more devices capable of receiving, generating, storing, processing, and/or providing program code or information associated with program code (e.g., text, a token, an error, a pattern, etc.). For example, client device 810 may include a computing device, such as a desktop computer, a laptop computer, a tablet computer, a mobile phone (e.g., a smart phone, a radiotelephone, etc.), or a similar device. Client device 810 may receive input text, via TCE 820, in a programming language associated with TCE 820. Client device 810 may process the input text to determine whether the input text is valid. When the input text is invalid, client device 810 may determine valid program code based on the input text, as described in more detail elsewhere herein. Client device 810 may prompt a user (e.g., via a user interface of TCE 820) regarding the valid program code or may replace the input text with the valid program code. In some implementations, client device 810 may receive information from and/or transmit information to server device 830.

Client device 810 may host TCE 820. TCE 820 may include any hardware-based component or a combination of hardware and software-based components that provides a computing environment that allows tasks to be performed (e.g., by users) related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc. In some implementations, TCE 820 may include a programming language that supports dynamic typing (e.g., the M language, a MATLAB® language, a MATLAB-compatible language, a MATLAB-like language, Julia, Python, etc.) that can be used to express problems and/or solutions in mathematical notations.

For example, TCE 820 may use an array as a basic element, where the array may not require dimensioning. These arrays may be used to support array-based programming where an operation may apply to an entire set of values included in the arrays. Array-based programming may allow array-based operations to be treated as high-level programming that may allow, for example, operations to be performed on entire aggregations of data without having to resort to explicit loops of individual non-array operations. In addition, TCE 820 may be adapted to perform matrix and/or vector formulations that can be used for data analysis, data visualization, application development, simulation, modeling, algorithm development, etc. These matrix and/or vector formulations may be used in many areas, such as statistics, image processing, signal processing, control design, life sciences modeling, discrete event analysis and/or design, state-based analysis and/or design, etc.

TCE 820 may further provide mathematical functions and/or graphical tools (e.g., for creating plots, surfaces, images, volumetric representations, etc.). For example, TCE 820 can provide graphical tools for viewing or analysis of large datasets, as described herein. In some embodiments, TCE 820 can enable implementation determination of a design parameter based on other design parameters, using the relationships described herein. Thus, consistent with disclosed embodiments, TCE 820 can enable a user to select design parameters (e.g., datatypes, minimum noise values, matrix dimensions, overflow probabilities, or the like) without conducting extensive simulations or defaulting to unnecessarily complex datatypes (e.g., double precision floating-point datatypes, or the like). In some implementations, TCE 820 may provide these functions and/or tools using toolboxes (e.g., toolboxes for signal processing, image processing, data plotting, parallel processing, etc.). In some implementations, TCE 820 may provide these functions as block sets or in another way, such as via a library, etc.

TCE 820 may be implemented as a text-based programming environment (e.g., MATLAB software; Octave; Python; Julia by Julia Computing, Inc., Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; Modelica or Dymola from Dynasim; etc.), a graphically-based programming environment (e.g., Simulink® software, Stateflow® software, SimEvents® software, Simscape™ software, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from Telelogic; Ptolemy from the University of California at Berkeley; aspects of a Unified Modeling Language (UML) or SysML environment; etc.), or another type of programming environment, such as a hybrid programming environment that includes one or more text-based programming environments and one or more graphically-based programming environments.

TCE 820 may include a programming language (e.g., the MATLAB language) that may be used to express problems and/or solutions in mathematical notations. The programming language may allow a user to enter commands to be executed by TCE 820. The programming language may be dynamically typed and/or array based. In a dynamically typed array-based computing language, data may be contained in arrays and data types of the data may be determined (e.g., assigned) at program execution time.

For example, suppose a program, written in a dynamically typed array-based computing language, includes the following statements:

$A=$'hello'

$A=\text{int32}([1,2])$ $A=[1.1,2.2,3.3]$

Now suppose the program is executed, for example, in a TCE, such as TCE 820. During run-time, when the statement "A='hello'" is executed, the data type of variable "A" may be a string data type. Later when the statement "A=int32([1, 2])" is executed, the data type of variable "A" may be a 1-by-2 array containing elements whose data type are 32-bit integers. Later, when the statement "A=[1.1, 2.2, 3.3]" is executed, since the language is dynamically typed, the data type of variable "A" may be changed from the above 1-by-2 Array to a 1-by-3 array containing floating-point elements. As can be seen by this example, data in a program written in a dynamically typed array-based computing language may be contained in an array. Moreover, the data type of the data may be determined during execution of the program. Thus, in a dynamically type array-based computing language, data may be represented by arrays and data types of data may be determined at run-time.

TCE 820 may provide mathematical routines and a high-level programming language suitable for non-professional programmers. TCE 820 may provide graphical tools that may be used for creating plots, surfaces, images, volumetric representations, or other representations. TCE 820 may provide these routines and/or tools using toolboxes (e.g., toolboxes for signal processing, image processing, data plotting, parallel processing, etc.). TCE 820 may also provide these routines in other ways, such as, for example, via a library, a local data structure, a remote data structure (e.g., a database operating in a computing cloud), a remote procedure call (RPC), and/or an application programming interface (API). TCE 820 may be configured to improve runtime performance when performing computing operations. For example, TCE 820 may include a just-in-time (JIT) compiler.

Server device 830 may include one or more devices capable of receiving, generating, storing, processing, and/or providing information associated with code. For example, server device 830 may include a computing device, such as a server, a desktop computer, a laptop computer, a tablet computer, or a similar device. In some implementations, server device 830 may host TCE 820. In some implementations, client device 810 may be used to access one or more TCEs 820 running on one or more server devices 830. For example, multiple server devices 830 may be used to execute program code (e.g., serially or in parallel), and may provide respective results of executing the program code to client device 810.

In some implementations, client device 810 and server device 830 may be owned by different entities. For example, an end user may own client device 810, and a third party may own server device 830. In some implementations, server device 830 may include a device operating in a cloud computing environment. In this way, front-end applications (e.g., a user interface) may be separated from back-end applications (e.g., program code execution). Additionally, or alternatively, server device 830 may perform one, more, or all operations described elsewhere herein as being performed by client device 810.

Network 840 may include one or more wired and/or wireless networks. For example, network 840 may include a cellular network, a public land mobile network (PLMN), a local area network (LAN), a wide area network (WAN), a metropolitan area network (MAN), a telephone network (e.g., the Public Switched Telephone Network (PSTN)), an ad hoc network, an intranet, the Internet, a fiber optic-based network, a private network, a cloud computing network, and/or a combination of these or other types of networks.

The number and arrangement of devices and networks shown in FIG. 8 are provided as an example. In practice, there may be additional devices and/or networks, fewer devices and/or networks, different devices and/or networks, or differently arranged devices and/or networks than those shown in FIG. 8. Furthermore, two or more devices shown in FIG. 8 may be implemented within a single device, or a single device shown in FIG. 8 may be implemented as multiple, distributed devices. Additionally, or alternatively, a set of devices (e.g., one or more devices) of environment 800 may perform one or more functions described as being performed by another set of devices of environment 800.

FIG. 9 depicts an exemplary device 900 suitable for use consistent with the disclosed embodiments. Device 900 may correspond to client device 810, server device 830, or a like device. In some implementations, client device 810, server device 830, or the like device may include at least one of device 900 or at least one component of device 900. As shown in FIG. 9, device 900 may include a bus 910, a processor 920, a memory 930, a storage component 940, an input component 950, an output component 960, and a communication interface 970.

Bus 910 can include a component that permits communication among the components of device 900. Processor 920 can be implemented in hardware, firmware, or a combination of hardware and software. Processor 920 can be a central processing unit (CPU), a graphics processing unit (GPU), a digital signal processor (DSP), an accelerated processing unit (APU), a microprocessor, a microcontroller, a field-programmable gate array (FPGA), an application-specific integrated circuit (ASIC), or another suitable processing component. In some implementations, processor 920 can include one or more processors capable of being programmed to perform a function. Memory 930 can include a random-access memory (RAM), a read-only memory (ROM), or another suitable dynamic or static storage device (e.g., a flash memory, a magnetic memory, and/or an optical memory) that stores information and/or instructions for use by processor 920.

Storage component 940 can store information and/or software related to the operation and use of device 900. For example, storage component 940 can include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 950 can include a component that permits device 900 to receive information, such as via user input (e.g., a touch screen display, a keyboard, a keypad, a mouse, a button, a switch, and/or a microphone). Additionally, or alternatively, input component 950 can include a sensor for sensing information (e.g., a global positioning system (GPS) component, an accelerometer, a gyroscope, and/or an actuator). Output component 960 can include a component that provides output information from device 900 (e.g., a display, a speaker, and/or one or more light-emitting diodes (LEDs)).

Communication interface 970 can include a transceiver-like component (e.g., a transceiver and/or a separate receiver and transmitter) that enables device 900 to communicate with other devices, such as via a wired connection, a wireless connection, or a combination of wired and wireless connections. Communication interface 970 can permit device 900 to receive information from another device and/or provide information to another device. For example, communication interface 970 can include an Ethernet interface, an optical interface, a coaxial interface, an infrared interface, a radio frequency (RF) interface, a universal serial bus (USB) interface, a Wi-Fi interface, a cellular network interface, or the like.

Device 900 can be configured to perform one or more processes described herein. Device 900 may perform these processes (e.g., a computer-implemented method) in response to processor 920 executing software instructions stored by a non-transitory computer-readable medium, such as memory 930 or storage component 940. A computer-readable medium can be a non-transitory memory device. A memory device can include memory space within a single physical storage device or memory space spread across multiple physical storage devices.

Software instructions can be read into memory 930 or storage component 940 from another computer-readable medium or from another device via communication interface 970. When executed, software instructions stored in memory 930 or storage component 940 can cause processor 920 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 9 are provided as an example. In practice, device 900 can include additional components, fewer components, different components, or differently arranged components than those shown in FIG. 9. Additionally, or alternatively, a set of components (e.g., one or more components) of device 900 may perform one or more functions described as being performed by another set of components of device 900.

The foregoing description has been presented for purposes of illustration. It is not exhaustive and is not limited to precise forms or embodiments disclosed. Modifications and adaptations of the embodiments will be apparent from consideration of the specification and practice of the disclosed embodiments. For example, the described implementations include hardware, but systems and methods consistent with the present disclosure can be implemented with hardware and software. In addition, while certain components have been described as being coupled to one another, such components may be integrated with one another or distributed in any suitable fashion.

Moreover, while illustrative embodiments have been described herein, the scope includes any and all embodiments having equivalent elements, modifications, omissions, combinations (e.g., of aspects across various embodiments), adaptations or alterations based on the present disclosure. The elements in the claims are to be interpreted broadly based on the language employed in the claims and not limited to examples described in the present specification or during the prosecution of the application, which examples are to be construed as nonexclusive. Further, the steps of the disclosed methods can be modified in any manner, including reordering steps or inserting or deleting steps.

The features and advantages of the disclosure are apparent from the detailed specification, and thus, it is intended that the appended claims cover all systems and methods falling within the true spirit and scope of the disclosure. As used herein, the indefinite articles "a" and "an" mean "one or more." Similarly, the use of a plural term does not necessarily denote a plurality unless it is unambiguous in the given context. Further, since numerous modifications and variations will readily occur from studying the present disclosure, it is not desired to limit the disclosure to the exact construction and operation illustrated and described, and accordingly, all suitable modifications and equivalents may be resorted to, falling within the scope of the disclosure.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Other embodiments will be apparent from consideration of the specification and practice of the embodiments disclosed herein. It is intended that the specification and examples be considered as example only, with a true scope and spirit of the disclosed embodiments being indicated by the following claims.

What is claimed is:

1. A method for selecting a datatype for use by software running on a device, comprising:
   for a model representing a behavior of the device, wherein the model has an input and an output and includes an operation representable by a matrix,
   obtaining a size of the matrix, an overflow probability for the operation, and statistics information concerning a noise of the device;
   determining a singular value bound for the matrix based on the size, the overflow probability, and the statistics information;
   determining one or more of:
      a numerical range for the output based on information about the input and the singular value bound, or
      a numerical range for the input based on information about the output and the singular value bound;
   selecting the datatype for the input or the output, based at least in part on the determined one or more of:
      the numerical range of the output, or
      the numerical range of the input;
   providing an indication of the selected datatype; and
   simulating the behavior of the device using the selected datatype.

2. The method of claim 1, wherein the method further comprises generating the software for the device from the model using the selected datatype.

3. The method of claim 2, wherein the method further comprises deploying the generated software onto the device.

4. The method of claim 1, wherein the selected datatype is a fixed-point datatype or a floating-point datatype.

5. The method of claim 1, wherein the noise is thermal noise or quantization noise.

6. The method of claim 1, wherein the operation comprises least-squares estimation, neural network training or prediction, or Kalman filtering.

7. The method of claim 1, wherein the matrix represents differential equations characterizing the operation.

8. The method of claim 1, wherein the device comprises:
   a detection system or controller; or
   a beamformer, radar direction finder, or anti jamming device.

9. A method, comprising:
   for a model representing a behavior of a system, wherein the model has an input and an output and includes an operation representable by a matrix, obtaining a size of the matrix, an overflow probability for the operation, and a numerical input range and a numerical output range of the model;
   determining a singular value bound for the matrix based on the size, numerical input range, and numerical output range;
   determining, using the singular value bound and the overflow probability, statistics information concerning a noise of the system;
   providing an indication of a minimum noise value, the minimum noise value being based on the statistics information; and
   simulating the system using a noise value for the noise, the noise value being greater than or equal to the minimum noise value.

10. The method of claim 9, wherein the noise is thermal noise or quantization noise.

11. The method of claim 9, wherein the operation comprises least-squares estimation, neural network training or prediction, or Kalman filtering.

12. The method of claim 9, wherein the matrix represents differential equations characterizing the operation.

13. The method of claim 12, wherein obtaining the size of the matrix includes generating the matrix by linearizing non-linear ordinary differential equation.

14. The method of claim 9, wherein the system comprises:
   a detection system or controller; or
   a beamformer, radar direction finder, or anti jamming device.

15. A method for determining, for a model representing a behavior of a device, the model having an input and an output and including a matrix representing characteristics or operations of the device, dimensions of the matrix, comprising:
   obtaining an input range, output range, noise value for a noise in the device, and overflow probability for the device;

determining, using the input range and the output range, a scaled singular value bound for the matrix;

determining, using the scaled singular value bound, the overflow probability, and the noise value a size of the matrix, the size specifying a number of observations and a number of values for each observation;

providing an indication of the determined size of the matrix; and configuring the device to determine device outputs using: the number of observations and the number of values for each observation.

16. The method of claim 15, wherein the noise is thermal noise or quantization noise.

17. The method of claim 15, wherein the characteristics or operations comprise least-squares estimation, neural network training or prediction, or Kalman filtering.

18. The method of claim 15, wherein the device comprises a beamformer, radar direction finder, or anti-jamming device.

19. A system for selecting a datatype for use by software running on a device, comprising:
at least one processor; and
at least one non-transitory computer-readable medium containing instructions, that when executed by the at least one processor, cause the system to perform system operations comprising:
for a model representing a behavior of the device, wherein the model has an input and an output and includes an operation representable by a matrix,
obtaining a size of the matrix, an overflow probability for the operation, and statistics information concerning a noise of the device;
determining a singular value bound for the matrix based on the size, the overflow probability, and the statistics information;
determining one or more of:
a numerical range for the output based on information about the input and the singular value bound, or
a numerical range for the input based on information about the output and the singular value bound;
selecting the datatype for the input or the output, based at least in part on the determined one or more of:
the numerical range of the output, or
the numerical range of the input; and
providing an indication of the selected datatype.

20. A non-transitory computer-readable medium containing instructions, that when executed by at least one processor, cause a system to perform system operations comprising:
for a model representing a behavior of a device, wherein the model has an input and an output and includes an operation representable by a matrix,
obtaining a size of the matrix, an overflow probability for the operation, and statistics information concerning a noise of the device;
determining a singular value bound for the matrix based on the size, the overflow probability, and the statistics information;
determining one or more of:
a numerical range for the output based on information about the input and the singular value bound, or
a numerical range for the input based on information about the output and the singular value bound;
selecting a datatype for the input or the output, based at least in part on the determined one or more of:
the numerical range of the output, or
the numerical range of the input; and
providing an indication of the selected datatype.

21. The system of claim 19, wherein the system operations further comprise simulating the behavior of the device using the selected datatype.

22. The system of claim 21, wherein the selected datatype is a fixed-point datatype or a floating-point datatype.

23. The system of claim 21, wherein the noise is thermal noise or quantization noise.

24. The system of claim 21, wherein the operation representable by the matrix comprises least-squares estimation, neural network training or prediction, or Kalman filtering.

25. The non-transitory computer-readable medium of claim 20, wherein the system operations further comprise simulating the behavior of the device using the selected datatype.

26. The non-transitory computer-readable medium of claim 20, wherein the system operations further include generating software for the device from the model using the selected datatype.

27. The non-transitory computer-readable medium of claim 26, wherein the system operations further include deploying the generated software onto the device.

28. The non-transitory computer-readable medium of claim 26, wherein the selected datatype is a fixed-point datatype or a floating-point datatype.

29. The non-transitory computer-readable medium of claim 26, wherein the noise is thermal noise or quantization noise.

30. The non-transitory computer-readable medium of claim 26, wherein the operation comprises least-squares estimation, neural network training or prediction, or Kalman filtering.

31. The non-transitory computer-readable medium of claim 26, wherein the matrix represents differential equations characterizing the operation.

* * * * *

UNITED STATES PATENT AND TRADEMARK OFFICE
CERTIFICATE OF CORRECTION

PATENT NO. : 12,045,737 B2
APPLICATION NO. : 16/947130
DATED : July 23, 2024
INVENTOR(S) : Bryan et al.

It is certified that error appears in the above-identified patent and that said Letters Patent is hereby corrected as shown below:

In the Claims

Claim 8, Column 46, Line 25, "anti jamming" should read --anti-jamming--.

Claim 14, Column 46, Line 58, "anti jamming" should read --anti-jamming--.

Claim 15, Column 47, Line 4, "and the noise value" should read --and the noise value:--.

Signed and Sealed this
Third Day of September, 2024

Katherine Kelly Vidal
*Director of the United States Patent and Trademark Office*